(12) United States Patent
Kim et al.

(10) Patent No.: US 9,935,108 B2
(45) Date of Patent: Apr. 3, 2018

(54) SEMICONDUCTOR MEMORY DEVICE

(71) Applicants: Chul-Ho Kim, Seoul (KR); Seunghak Park, Seoul (KR); Sihyun Kim, Seoul (KR); Cheolhong Kim, Yongin-si (KR); Hunkook Lee, Hwaseong-si (KR); Yongju Jung, Hwaseong-si (KR)

(72) Inventors: Chul-Ho Kim, Seoul (KR); Seunghak Park, Seoul (KR); Sihyun Kim, Seoul (KR); Cheolhong Kim, Yongin-si (KR); Hunkook Lee, Hwaseong-si (KR); Yongju Jung, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 56 days.

(21) Appl. No.: 15/282,208

(22) Filed: Sep. 30, 2016

(65) Prior Publication Data
US 2017/0194326 A1   Jul. 6, 2017

(30) Foreign Application Priority Data
Dec. 31, 2015 (KR) .................. 10-2015-0190831

(51) Int. Cl.
H01L 27/1157 (2017.01)
H01L 27/105 (2006.01)
H01L 23/528 (2006.01)
H01L 29/78 (2006.01)
H01L 27/11565 (2017.01)
H01L 27/11575 (2017.01)
H01L 27/11582 (2017.01)

(52) U.S. Cl.
CPC ...... H01L 27/1052 (2013.01); H01L 23/5283 (2013.01); H01L 27/1157 (2013.01); H01L 27/11565 (2013.01); H01L 27/11575 (2013.01); H01L 27/11582 (2013.01); H01L 29/7827 (2013.01)

(58) Field of Classification Search
CPC .......... H01L 27/1052; H01L 27/11582; H01L 27/11575; H01L 27/1157; H01L 27/11565; H01L 29/7827; H01L 23/5283
See application file for complete search history.

(56) References Cited

U.S. PATENT DOCUMENTS 8,092,958 B2   1/2012   Haffner
8,169,826 B2   5/2012   Hishida et al.
8,598,712 B2   12/2013  Huang et al.
(Continued)

FOREIGN PATENT DOCUMENTS

KR   1020130072671   7/2013

Primary Examiner — Kyoung Lee
(74) Attorney, Agent, or Firm — Volentine & Whitt, PLLC

(57) ABSTRACT

A semiconductor memory device includes stacks on a substrate, each of the stacks including word lines stacked on the substrate and first and second string selection lines laterally spaced apart from each other, vertical pillars passing through the stacks, and first and second bit lines extending longitudinally in a first direction and alternatingly arranged in a second direction crossing the first direction. In a plan view, at least two adjacent ones of the first bit lines in the second direction and at least one of the second bit lines overlap each vertical pillar. A distance between a center of the vertical pillar and one of the first bit lines is different from that between the center of the vertical pillar and another of the first bit lines.

20 Claims, 25 Drawing Sheets

(56) References Cited

U.S. PATENT DOCUMENTS

| | | |
|---|---|---|
| 9,064,735 B2 | 6/2015 | Kito et al. |
| 9,236,340 B2 | 1/2016 | Lee et al. |
| 9,287,167 B2 | 3/2016 | Seol et al. |
| 9,437,605 B2 * | 9/2016 | Chen .................. H01L 27/1157 |
| 2015/0145014 A1 | 5/2015 | Shin et al. |
| 2015/0194517 A1 | 7/2015 | Cheng et al. |
| 2015/0194518 A1 | 7/2015 | Cheng et al. |

* cited by examiner

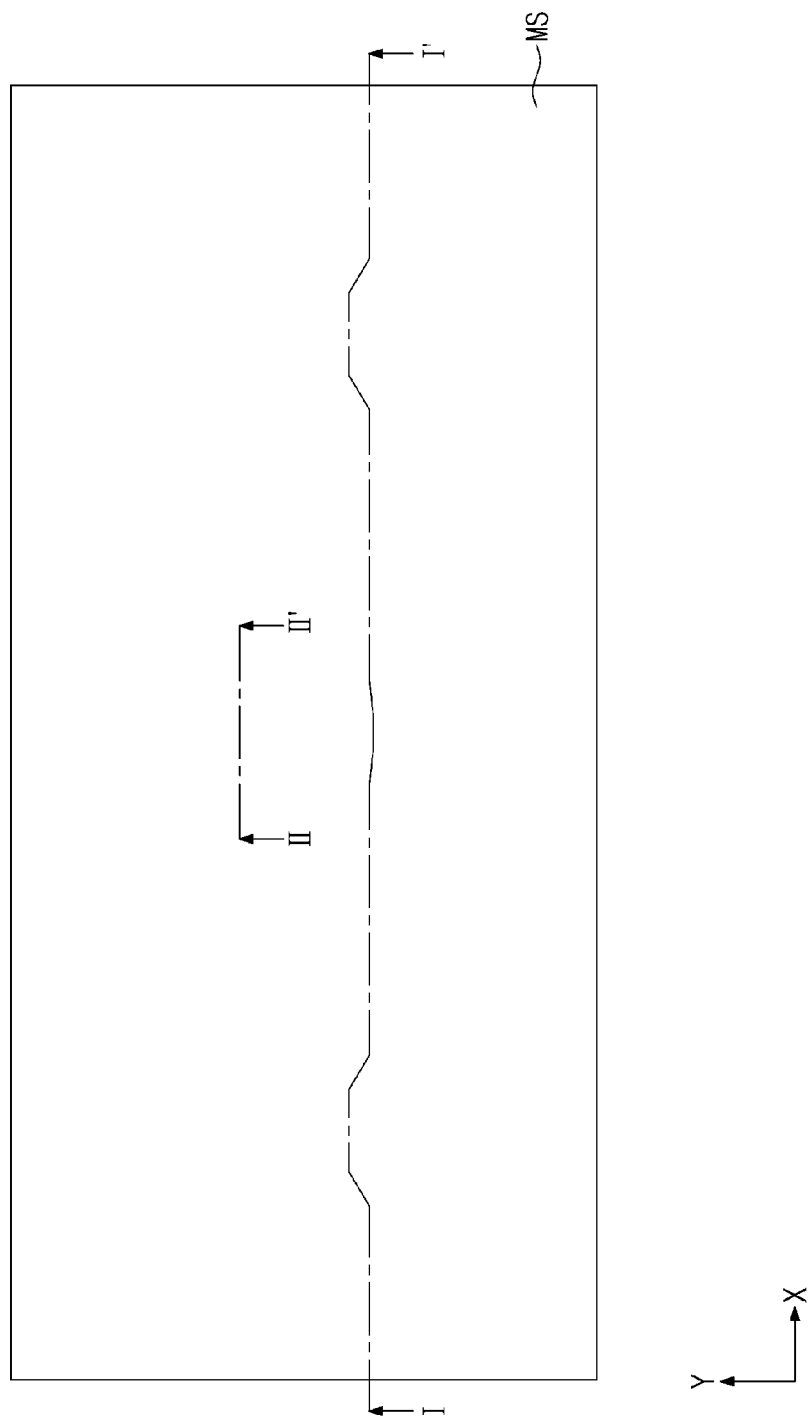

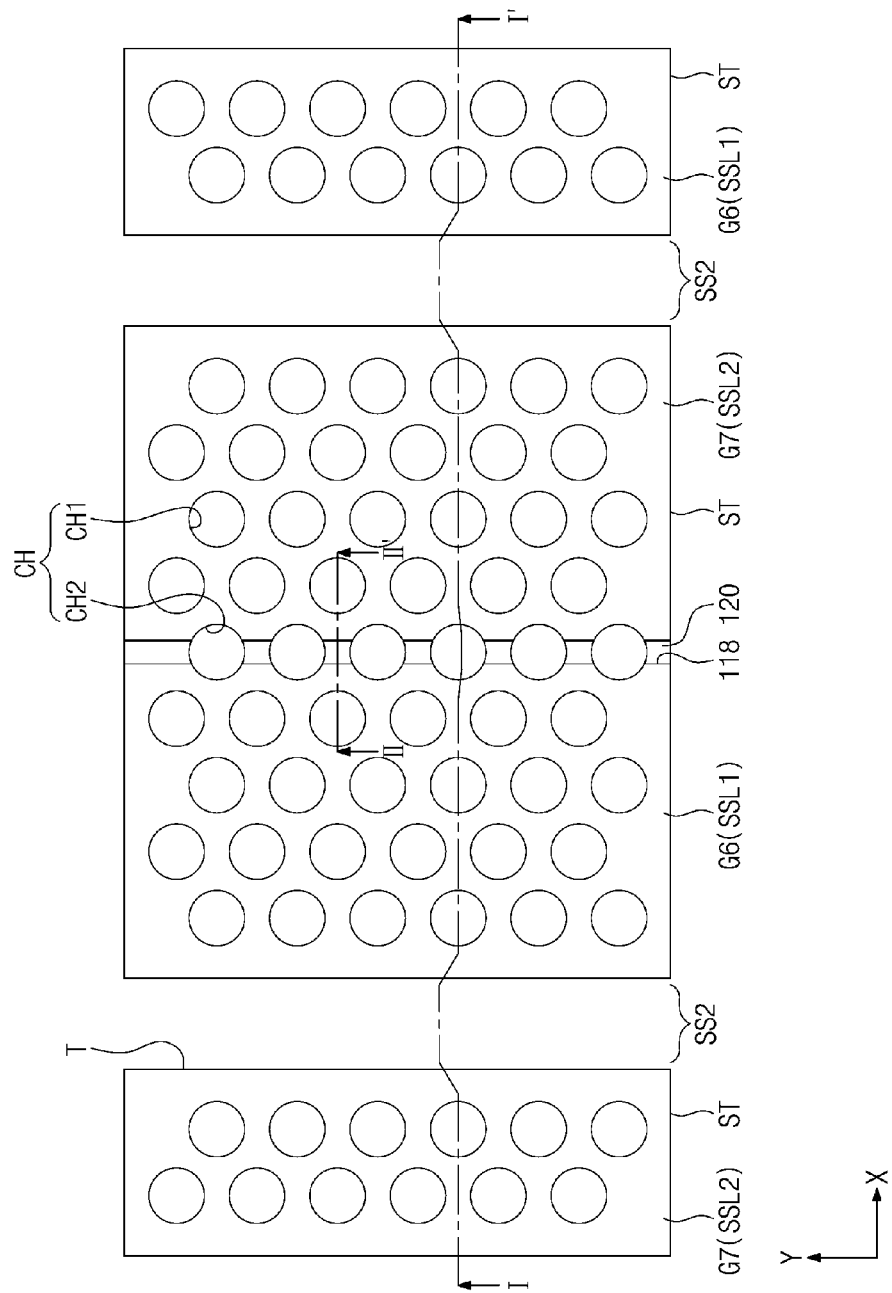

SEMICONDUCTOR MEMORY DEVICE

PRIORITY STATEMENT

This U.S. non-provisional patent application claims priority under 35 U.S.C. § 119 to Korean Patent Application No. 10-2015-0190831, filed on Dec. 31, 2015, in the Korean Intellectual Property Office, the entire contents of which are hereby incorporated by reference.

BACKGROUND

The inventive concept relates to a semiconductor memory device, and in particular, to a three-dimensional semiconductor memory device.

In the case of semiconductor devices, increased integration is especially desired because integration is an important factor in determining product prices. In particular, higher integration of semiconductor devices is required to satisfy consumer demands for electronic products that offer superior performance and yet are relatively inexpensive. In the case of typical two-dimensional or planar semiconductor devices, integration is mainly a factor of the area occupied by a unit memory cell of the devices. Therefore, the degree to which two-dimensional or planar semiconductor devices can be integrated greatly depends on techniques for forming the patterns of features that constitute memory cells, i.e., fine pattern forming technologies. However, process equipment that can produce very fine patterns is extremely expensive and becomes increasingly expensive the finer the patterns to be produced become. Thus, the overhead associated with process equipment becomes cost-prohibitive when considering modifying or developing such equipment to increase the integration of, i.e., scale down, two-dimensional or planar semiconductor devices.

Three-dimensional (3D) semiconductor memory devices including three-dimensionally-arranged memory cells have been proposed to provide highly integrated devices that can be manufactured economically. However, there are still significant obstacles in manufacturing low-cost, 3D semiconductor memory devices, particularly in the mass-fabrication of 3D devices that possess or exceed the operational reliability of their 2D counterparts.

SUMMARY

According to some examples of the inventive concept, a semiconductor memory device includes a substrate, stacks on the substrate and comprising word lines disposed one on another and first and second string selection lines laterally spaced apart from each other, vertical pillars passing through the stacks, and first bit lines and second bit lines extending longitudinally in a first direction. The first bit lines are alternatingly disposed with the second bit lines in a second direction crossing the first direction. With respect to each of the vertical pillars, at least two of the first bit lines which are adjacent to each other in the second direction, and each of the second bit lines which is interposed between adjacent ones of said at least two of the first bit lines overlap the vertical pillar in a plan view of the vertical pillars and bit lines. And, a shortest distance in the second direction between an axial center of each of the vertical pillars and one of the first bit lines overlapping the vertical pillar is different from a shortest distance in the second direction between the axial center of the vertical pillar and another of the first bit lines overlapping the vertical pillar.

According to some examples of the inventive concept, a semiconductor memory device includes a substrate, stacks on the substrate and comprising word lines disposed one on another and first and second string selection lines laterally spaced apart from each other in a first direction, a first separation structure extending in a second direction and comprising an insulating separation layer between the first and second string selection lines, and dummy vertical pillars passing through the insulating separation layer and one of the stacks, a second separation structure extending in the second direction between the stacks, active vertical pillars passing through the stacks, first auxiliary lines crossing the first separation structure, wherein each of the first auxiliary lines has a first protrusion and electrically connects respective ones of the vertical pillars which are adjacent to each other in the first direction; and second auxiliary lines crossing the second separation structure, wherein each of the second auxiliary lines has a second protrusion and electrically connects respective ones of the vertical pillars which are adjacent to each other in the first direction. The first protrusion of each of the first auxiliary lines subtends an angle with an associated reference line passing through axial centers of the vertical pillars electrically connected by the first auxiliary line, and the second protrusion of each of the second auxiliary lines subtends an angle with an associated reference line passing through axial centers of the vertical pillars electrically connected by the second auxiliary line, in a plan view of the first and second auxiliary lines and vertical pillars. The angle subtended by the first protrusion and the reference line associated therewith is different from the angle subtended by the second protrusion and the reference line associated therewith.

According to some examples of the inventive concept, a semiconductor memory device includes a substrate, layers stacked one above an another on the substrate and comprising a plurality of word lines, pillars extending vertically through the layers and arrayed in rows and columns extending in first and second directions, respectively, first bit lines and second bit lines, and a first auxiliary line, and a second auxiliary line. The pillars include a first pair of respective active ones of the pillars adjacent one another in the same row and a second pair of respective active ones of the pillars adjacent one another in the same row, the first pair of respective ones of the pillars neighboring the second pair of respective ones of the pillars in the first direction, and the pillars of the first pair being spaced from one another in the first direction by a distance greater than that at which the pillars of the second pair are spaced from one another. The first bit lines and second bit lines extend longitudinally in one direction across the layers, and the first bit lines are alternatingly disposed with the second bit lines. The first auxiliary line spanning the pillars of the first pair and electrically connected thereto, and second auxiliary line electrically spans the pillars of the second pair. Also, the first auxiliary line bends between the pillars of the first pair in a plan view of the pillars and the auxiliary lines, and the first auxiliary line has a middle section that is overlapped by one of the first bit lines. That first bit line is electrically connected to the first auxiliary line at the middle section of the first auxiliary line. The second auxiliary line bends between the pillars of the second pair in the plan view of the pillars and the auxiliary lines, and the second auxiliary line has a middle section that is overlapped by one of the second bit lines and that second bit line is electrically connected to the second auxiliary line at the middle section of the second auxiliary line.

BRIEF DESCRIPTION OF THE DRAWINGS

The inventive concept will be more clearly understood from the following brief description of various non-limiting examples thereof illustrated in the accompanying drawings.

FIGS. 10A, 11A, 12A, 13A and 14A are plan views illustrating a method of fabricating a semiconductor memory device according to some examples of the inventive concept.

It should be noted that these figures are intended to illustrate the general characteristics of methods, structure and/or materials utilized in certain examples and to supplement the written description provided below. These drawings are not, however, to scale and may not precisely reflect the precise structural or performance characteristics of any given example, and should not be interpreted as defining or limiting the range of values or properties encompassed by examples. For example, the relative thicknesses and positioning of molecules, layers, regions and/or structural elements may be reduced or exaggerated for clarity. The use of similar or identical reference numbers in the various drawings is intended to indicate the presence of a similar element or feature.

DETAILED DESCRIPTION

Figure 1:
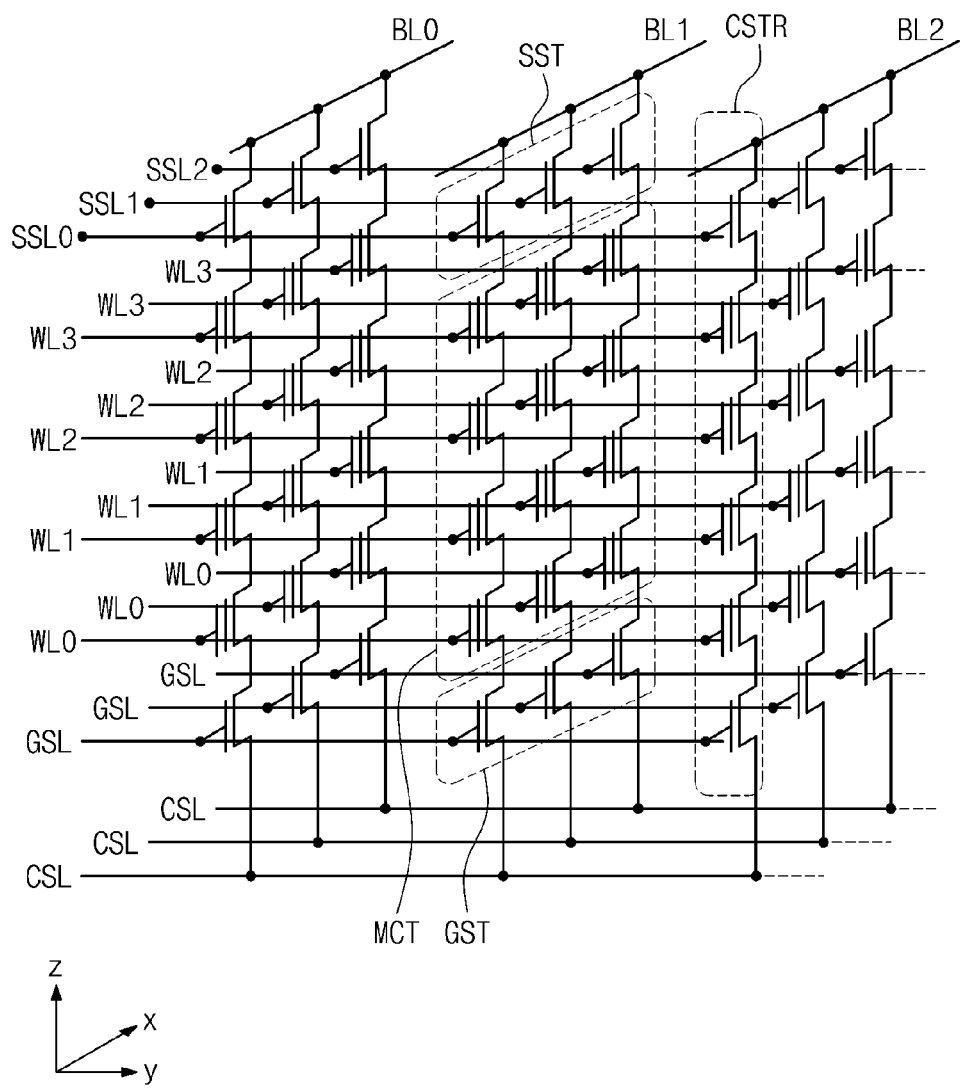
FIG. 1 is a circuit diagram of a cell array of some examples of a semiconductor memory device according to the inventive concept.

Referring to FIG. 1, semiconductor memory devices according to the inventive concept may include a common source line CSL, a plurality of bit lines BL0-BL2, and a plurality of cell strings CSTR interposed between and connected to the common source line CSL and the bit lines BL0-BL2.

The bit lines BL0-BL2 may be two-dimensionally arranged on a substrate and respective ones of the cell strings CSTR may be disposed in parallel as connected to each of the bit lines BL0-BL2. Accordingly, the cell strings CSTR may also be two-dimensionally arranged on the common source line CSL or the substrate.

Each of the cell strings CSTR may include a ground selection transistor GST connected to the common source line CSL, a string selection transistor SST connected to one of the bit lines BL0-BL2, and a plurality of memory cell transistors MCT interposed between ground and string selection transistors GST and SST. The ground selection transistor GST, the memory cell transistors MCT, and the string selection transistor SST constituting each of the cell strings CSTR may be serially connected to each other. Furthermore, a ground selection line GSL, a plurality of word lines WL0-WL3 and a plurality of string selection lines SSL0-SSL2 may be interposed between the common source line CSL and the bit lines BL0-BL2 to serve as gate electrodes of the ground selection transistor GST, the memory cell transistors MCT, and the string selection transistors SST, respectively.

The gate electrodes of the ground selection transistor GST may be connected in common to the ground selection line GSL, thereby being in an equipotential state. Similarly, the gate electrodes of the memory cell transistors MCT located at the same level may also be connected in common to one of the word lines WL0-WL3, thereby being in an equipotential state. Since each of the cell strings CSTR includes a plurality of the memory cell transistors MCT disposed at different levels from each other, the word lines WL0-WL3 may have a multi-layered structure, between the common source line CSL and the bit lines BL0-BL2.

The ground and string selection transistors GST and SST and the memory cell transistors MCT may be metal-oxide-semiconductor field effect transistors (MOSFETs), in which the channel structures are used as channel regions. In certain examples, the channel structure, in conjunction with the ground selection line GSL, the word lines WL0-WL3, and the string selection lines SSL0-SSL2, may constitute metal-oxide-semiconductor (MOS) capacitors. In this case, if a voltage higher than a threshold voltage of the MOS capacitor is applied to the ground selection line GSL, the word lines WL0-WL3, and the string selection lines SSL0-SSL2, a fringe field may be produced to form an inversion layer between the word lines WL0-WL3, and such a formation of the inversion layer may allow the ground selection transistor GST, the memory cell transistors MCT, and the string selection transistor SST to be electrically connected to each other.

Figure 2:
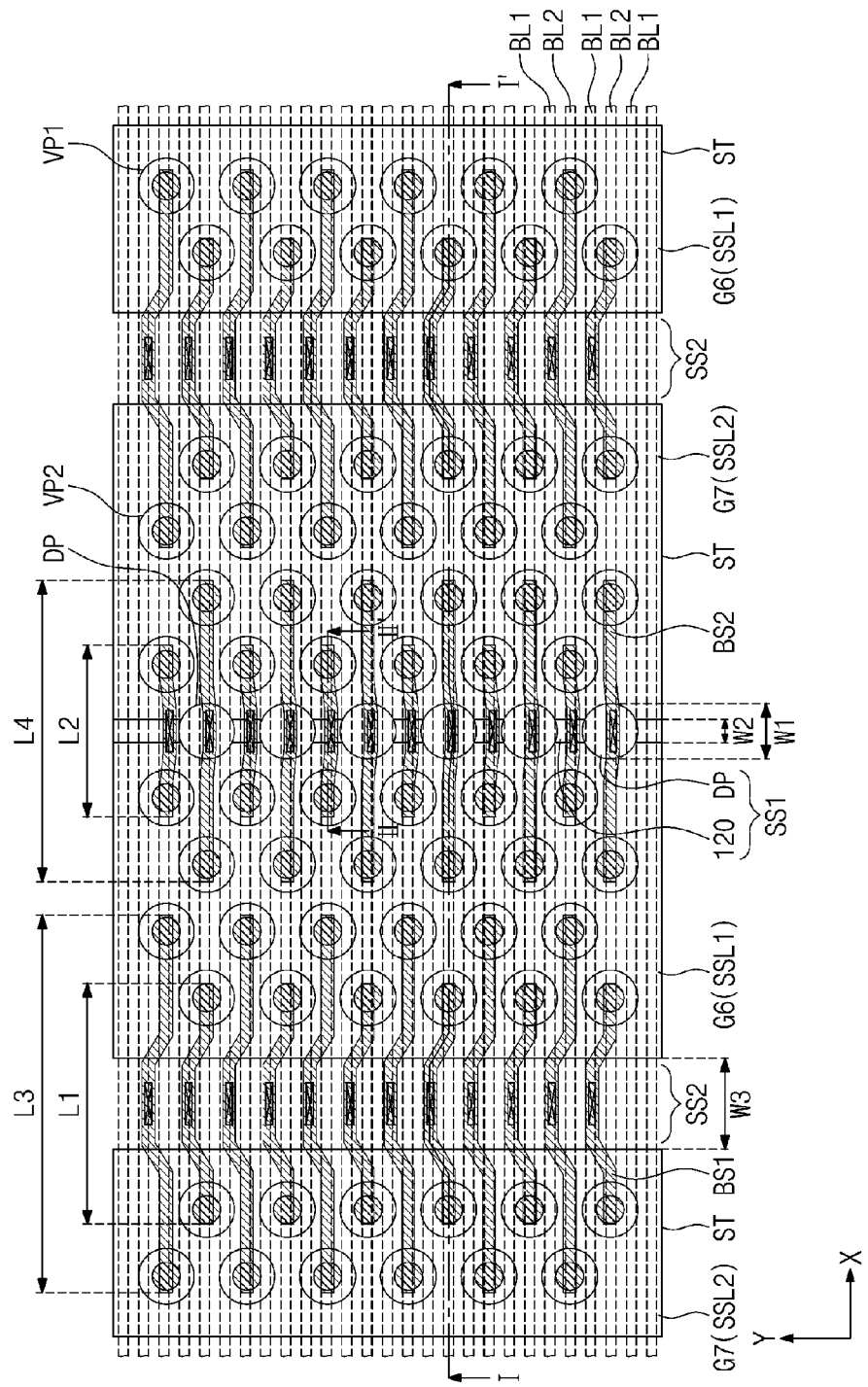
FIG. 2 is a plan view illustrating a semiconductor memory device according to some examples of the inventive concept.
Figure 3:
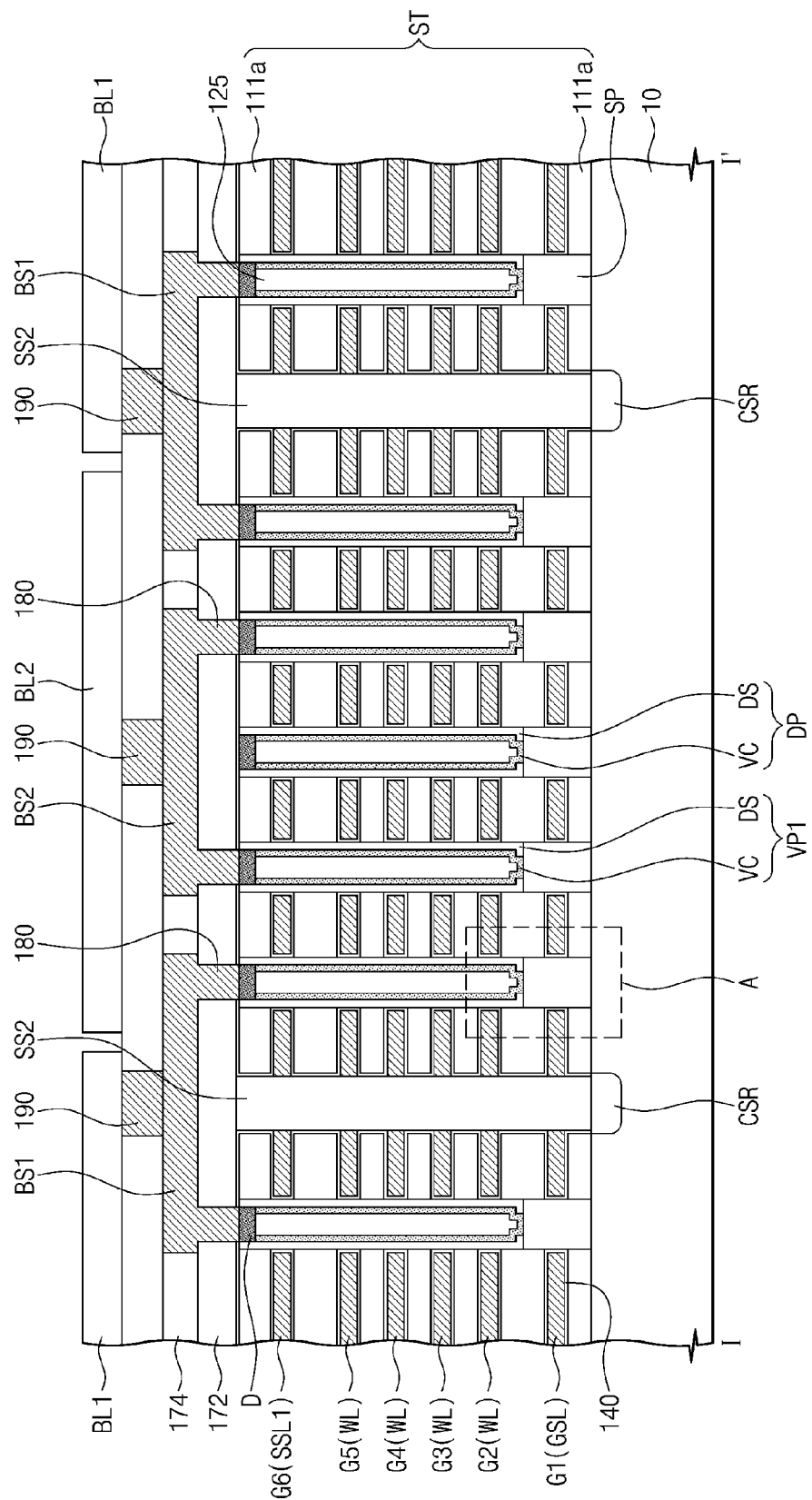
FIG. 3 is a sectional view, which is taken along line I-I' of FIG. 2 to illustrate a semiconductor memory device according to some examples of the inventive concept.
Figure 4:
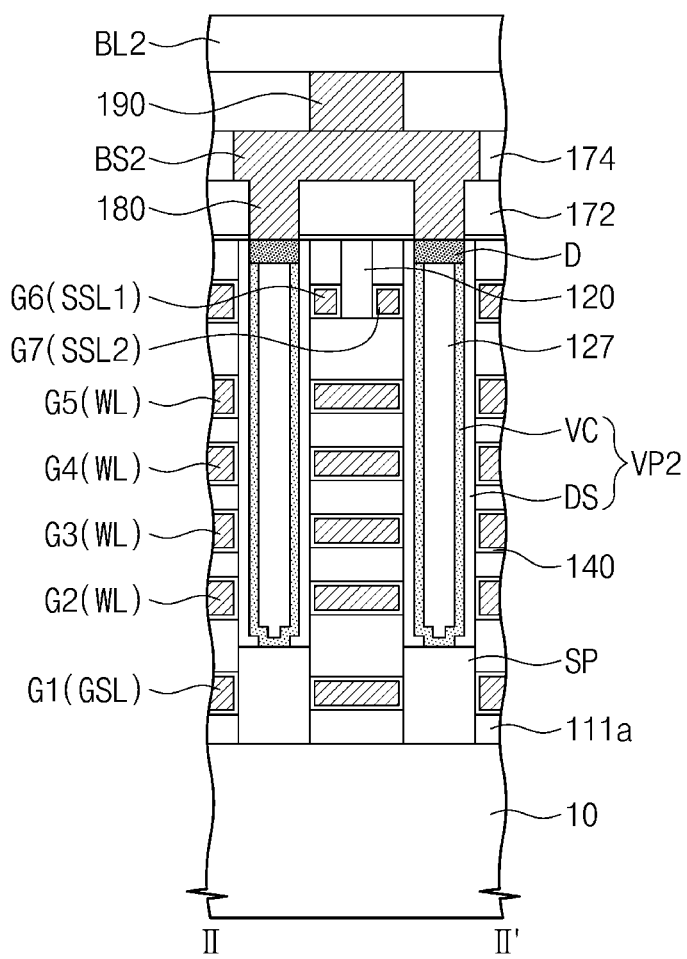
FIG. 4 is a sectional view, which is taken along line II-II' of FIG. 2 to illustrate a semiconductor memory device according to some examples of the inventive concept.

FIGS. 2-4 together illustrate examples of a semiconductor memory device according to the inventive concept. FIG. 2 is a plan view. FIG. 3 is a sectional view taken along line I-I' of FIG. 2. FIG. 4 is a sectional view taken along line II-II' of FIG. 2.

Referring to FIGS. 2 to 4, a plurality of stacks ST may be provided on a substrate 10. The substrate 10 may be a silicon substrate, a silicon-germanium substrate, a germanium substrate, or a single-crystalline epitaxial layer grown on a single-crystalline silicon substrate.

In some examples, the plurality of stacks ST may be provided on the substrate 10 to be spaced apart from each other in a first direction X and to have similar dimensions in a second direction Y crossing the first direction X. An impurity region CSR may be provided in the substrate 10 between the stacks ST. The impurity region CSR may extend the lengths of the stacks ST in the second direction Y. The impurity region CSR may correspond to the common source line CSL of FIG. 1. In this case, the impurity region CSR may be doped to have a conductivity type different from that of the substrate 10.

Each of the stacks ST may include insulating patterns 111a and gate electrodes G1-G7. The gate electrodes G1-G7 may include first to fifth gate electrodes G1-G5, which are stacked on the substrate 10 in a vertical direction perpendicular to a top surface of the substrate 10, and sixth and seventh gate electrodes G6 and G7, which are provided on the fifth gate electrode G5 and are spaced apart from each other in the first direction X. In other words, the sixth and seventh gate electrodes G6 and G7 may be located at the same level. The insulating patterns 111a may be interposed between the first to seventh gate electrodes G1-G7.

The first gate electrode G1, i.e., the lowermost one of the gate electrodes G1-G7, may be used as gate electrodes of the ground selection transistors (e.g., the ground selection lines GSL of FIG. 1). The sixth and seventh gate electrodes G6 and G7, i.e., the uppermost ones of the gate electrodes G1-G7, may be used as gate electrodes of the string selection transistors (e.g., the string selection lines SSL0-SSL2 of FIG. 1). The sixth and seventh gate electrodes G6 and G7 may be separated from each other by an insulating separation layer 120. The insulating separation layer 120 may be interposed between a first string selection line SSL1 and a second string selection line SSL2 and may extend the lengths of the sixth and seventh gate electrodes G6 and G7 in the second direction Y. The second to fifth gate electrodes G2, G3, G4, and G5, which are interposed between the lowermost and uppermost ones of the gate electrodes, may be used as cell gate electrodes (e.g., the word lines of FIG. 1).

The insulating patterns 111a may be formed of or include, for example, a silicon oxide layer. The first to seventh gate electrodes G1-G7 may be formed of one or include at least one material selected from the group consisting of doped silicon, metals (e.g., tungsten), metal nitrides, and metal silicides. The insulating separation layer 120 may be formed of or include, for example, a silicon oxide layer.

Vertical pillars VP1, VP2, and DP may extend through the stacks ST. The vertical pillars VP1, VP2, and DP may be spaced apart from each other in the first direction X and the second direction Y. That is, the vertical pillars VP1, VP2, and DP may be arrayed in rows each extending parallel to the X axis in FIG. 2 and in columns each extending parallel to the Y axis in FIG. 2. As an example, the vertical pillars VP1, VP2, and DP in each row may be offset (in the direction X) from the vertical pillars VP1, VP2, and DP in each row adjacent thereto. Thus, for every pair of adjacent rows of the vertical pillars VP1, VP2, and DP, the vertical pillars VP1, VP2, and DP may be disposed in a zigzag arrangement in the first direction X. For example, with reference to the central stack ST shown in FIG. 2, nine of such vertical pillars VP1, VP2, and DP are disposed in a zigzag arrangement.

The vertical pillars VP1, VP2, and DP may include first vertical pillars VP1, second vertical pillars VP2, and dummy vertical pillars DP. The first vertical pillars VP1 may extend through the stacks ST at positions spaced apart from the insulating separation layer 120 and may be coupled to the first string selection line SSL1. The second vertical pillars VP2 may extend through the stacks ST at positions spaced apart from the insulating separation layer 120 and may be coupled to the second string selection line SSL2. In a plan view, the dummy vertical pillars DP may extend through the stacks ST between the first and second string selection lines SSL1 and SSL2. In other words, the dummy vertical pillars DP may extend through the insulating separation layer 120 and divide the insulating separation layer 120 into a plurality of patterns in the second direction Y. Each of the dummy vertical pillars DP may have a diameter W1 that is greater than a width W2 of the insulating separation layer 120 (i.e., W1>W2).

Each of the vertical pillars VP1, VP2, and DP may include a vertical channel portion VC and a charge storing structure DS. The vertical channel portion VC may extend in a vertical direction perpendicular to the top surface of the substrate 10; for example, the vertical channel portion VC may extend through the stack ST and may be connected to the substrate 10. The vertical channel portion VC may have a hollow pipe shape, a hollow cylindrical shape, or a cup shape. The vertical channel portion VC may be formed of or include a semiconductor material. For example, the vertical channel portion VC may be formed of or include at least one of a polysilicon layer, an organic semiconductor layer, and carbon nanostructures.

The charge storing structure DS may be interposed between the vertical channel portion VC and the first to seventh gate electrodes G1-G7. For example, the charge storing structure DS may be interposed between the first to seventh gate electrodes G1-G7 and the vertical channel portion VC and may extend along sides of the vertical channel portion VC or in the vertical direction. In a plan view, the charge storing structure DS may encircle or surround the outer surface of the vertical channel portion VC.

Figure 5A:
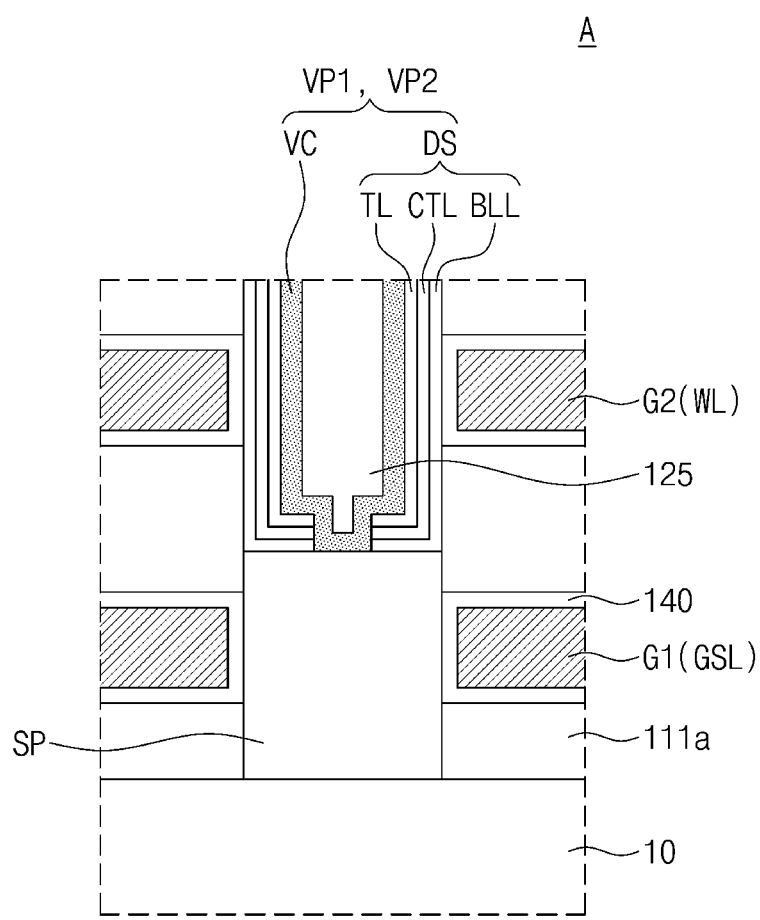
FIG. 5A is an enlarged view of a portion 'A' of FIG. 3.
Figure 5B:
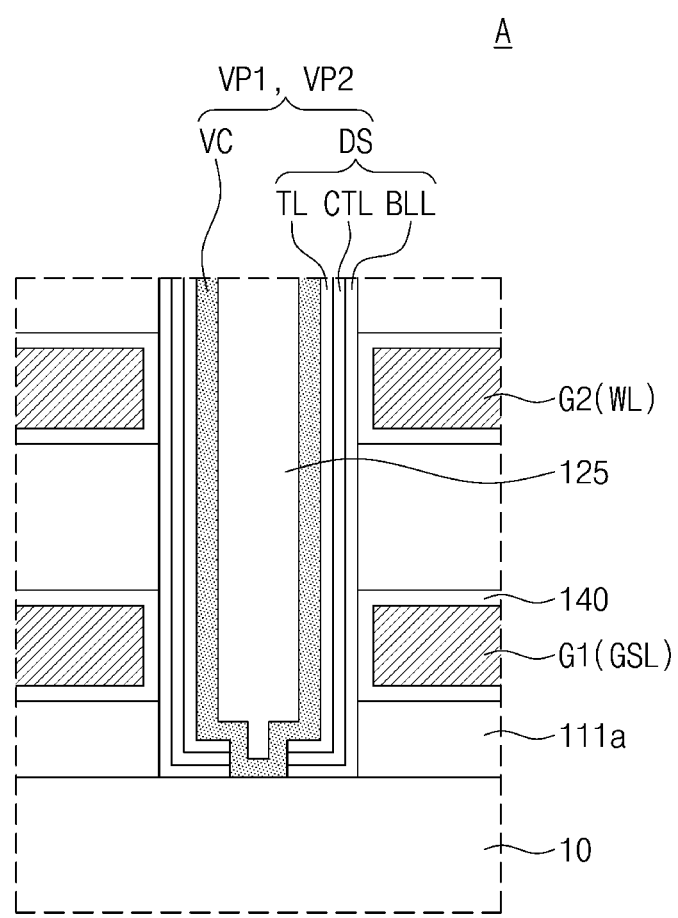
FIG. 5B is an enlarged view of a portion 'A' of FIG. 3.

As shown in FIGS. 5A and 5B, the charge storing structure DS may include a blocking insulating layer BLL, a charge storing layer CTL, and a tunnel insulating layer TL. The blocking insulating layer BLL, along with the vertical channel portion VC, may extend through the second to seventh gate electrodes G2-G7, as shown in FIG. 5A, or through the first to seventh gate electrodes G1-G7, as shown in FIG. 5B. The tunnel insulating layer TL may be interposed between the blocking insulating layer BLL and the vertical channel portion VC. The charge storing layer CTL may be interposed between the blocking insulating layer BLL and the tunnel insulating layer TL.

The blocking insulating layer BLL may include at least one of a silicon oxide layer and a high-k dielectric layer (e.g., aluminum oxide ($Al_2O_3$), hafnium oxide ($HfO_2$), etc.) the charge storing layer CTL may include a silicon nitride layer, and the tunnel insulating layer TL may include at least one of a silicon oxide layer and a high-k dielectric layer (e.g., aluminum oxide ($Al_2O_3$), hafnium oxide ($HfO_2$), etc.).

Referring to FIG. 5A, semiconductor pillars SP may be interposed between the vertical pillars VP1, VP2, and DP and the substrate 10. Each semiconductor pillar SP may contact the substrate 10, and the vertical channel portion VC may be electrically connected to the semiconductor pillar SP. The semiconductor pillar SP may extend through the first gate electrode G1. The semiconductor pillar SP may be formed of or include a semiconductor material, which is doped to have the same conductivity type as the substrate 10 or is undoped.

Alternatively, as shown in FIG. 5B, the vertical channel portion VC may extend through the first gate electrode G1 and be in contact with the substrate 10. In other words, the vertical channel portion VC may be directly connected to the substrate 10, without the semiconductor pillar SP interposed therebetween.

A gap-fill layer 125 may be provided in an internal space defined by the vertical channel portion VC. The gap-fill layer 125 may be formed of or include an insulating material (e.g., silicon oxide, silicon nitride, or silicon oxynitride).

Referring back to FIGS. 2 to 4, pads D may be provided on the vertical pillars VP1, VP2, and DP. Each of the pads D may be electrically connected to the vertical channel portion VC. The pads D may be formed of or include at least one of a conductive material and s semiconductor material doped to have a conductivity type different from the vertical channel portion VC.

A horizontal insulating layer 140 may be interposed between the charge storing structure DS and the first to seventh gate electrodes G1-G7. The horizontal insulating layer 140 may extend laterally over, i.e., may cover, top and bottom surfaces of each of the first to seventh gate electrodes G1-G7. In some examples, the horizontal insulating layer 140 may be formed of or include at least one of silicon oxide (e.g., $SiO_2$) and a dielectric material (e.g., aluminum oxide ($Al_2O_3$), hafnium oxide ($HfO_2$), etc.).

A second separation structure SS2 may be interposed between the stacks ST as spaced apart from the vertical pillars VP1, VP2, and DP and the insulating separation layer 120. The second separation structure SS2 may be provided on the impurity region CSR and may extend along the impurity region CSR or in the second direction Y. The second separation structure SS2 may be provided to separate the stacks ST from each other in the first direction X. The second separation structure SS2 may be shaped like a rectangle or line that is elongated in the second direction Y. A width W3 of the second separation structure SS2 may be greater than the width W2 of the insulating separation layer 120 (i.e., W3>W2)

The second separation structure SS2 may be formed of or include an insulating material (e.g., silicon oxide or silicon nitride). In certain examples, the second separation structure SS2 may include a conductive pattern (not shown) electrically connected to the impurity region CSR.

First and second insulating layers 172 and 174 may be sequentially stacked on the stacks ST. The first and second insulating layers 172 and 174 may be provided to cover the vertical pillars VP1, VP2, and DP. The first and second insulating layers 172 and 174 may be formed of or include at least one insulating material (e.g., silicon oxide, silicon nitride, etc.).

First contacts 180 may be provided on the first and second vertical pillars VP1 and VP2. The first contacts 180 may extend through the first insulating layer 172 and contact the pads D, respectively. The first contacts 180 may not be provided on the dummy vertical pillars DP. The first contacts 180 may be formed of or include at least one of conductive material (e.g., tungsten (W), copper (Cu), aluminum (Al), etc.).

First and second auxiliary lines BS1 and BS2 may be provided on the first insulating layer 172. Each of the first auxiliary lines BS1 may contact a pair of respective ones of the first contacts 180 adjacent to each other in the first direction X, thereby electrically connecting the first and second vertical pillars VP1 and VP2 of the pair to each other. Likewise, each of the second auxiliary lines BS2 may contact a pair of respective ones of the first contacts 180 adjacent to each other in the first direction X, thereby electrically connecting the first and second vertical pillars VP1 and VP2 of the pair to each other. As an example, each of the first and second auxiliary lines BS1 and BS2 may extend over the first insulating layer 172 from the first contacts 180 electrically connected by the auxiliary line. In some examples, each of the first and second auxiliary lines BS1 and BS2 and a pair of the first contacts 180 may be integral and thus be considered to collectively as a single pattern. The first and second auxiliary lines BS1 and BS2 may be formed of or include at least one conductive material (e.g., tungsten (W), copper (Cu), aluminum (Al), etc.).

Hereinafter, the insulating separation layer 120 and the dummy vertical pillars DP will be referred to as "a first separation structure SS1".

The first auxiliary lines BS1 may be provided to cross the second separation structure SS2 in the first direction X and may be arrayed in the second direction Y. The first and second vertical pillars VP1 and VP2 connected by a respective first auxiliary line BS1 may extend through different stacks ST, respectively, which are separated apart from each other by the second separation structure SS2.

The second auxiliary lines BS2 may cross the first separation structure SS1 in the first direction X and may be arrayed in the second direction Y. In a plan view, each of the second auxiliary lines BS2 may be interposed between two of the first auxiliary lines BS1 facing each other in the first direction X. The first and second vertical pillars VP1 and VP2 connected by a second auxiliary line BS2 may both extend through the same stack ST.

The first auxiliary lines BS1 may include two groups of first auxiliary lines BS1, the lines of the groups having first and third lengths L1 and L3 that are different from each other, and the two groups of the first auxiliary lines BS1 may be alternatingly arranged in the second direction Y. The second auxiliary lines BS2 may include two groups of second auxiliary lines BS2 having second and fourth lengths L2 and L4 that are different from each other, and the two groups of the second auxiliary lines BS2 may be alternatingly arranged in the second direction Y. Here, the first length L1 of the first auxiliary lines BS1 may be the smaller of or smallest among the lengths of the first auxiliary lines BS1, whereas the third length L3 of the first auxiliary lines BS1 may be the greater of or greatest among the lengths of the first auxiliary lines BS1. Also, the second length L2 of the second auxiliary lines BS2 may be the smaller of or smallest among the lengths of the second auxiliary lines BS2, whereas the fourth length L4 of the second auxiliary lines BS2 may be the greater of or greatest among the lengths of the second auxiliary lines BS2.

The smallest length of the first auxiliary lines BS1 may be longer than the smallest length of the second auxiliary lines BS2 (i.e., L1>L2), and the greatest length of the first auxiliary lines BS1 may be greater than the greatest length of the second auxiliary lines BS2 (i.e., L3>L4). The first auxiliary lines BS1 with the smaller lengths L1 and the second auxiliary lines BS2 with the greater lengths L4 may be alternatingly arranged in the first direction X. The first auxiliary lines BS1 with the greater lengths L3 and the second auxiliary lines BS2 with the smaller lengths L2 may be alternatingly arranged in the first direction X.

Also, each first auxiliary line BS1 having the greatest length (L3) among the lengths of the auxiliary lines BS1 and BS2 can be considered as neighboring a second auxiliary line BS2 (having either of the smaller lengths L2 or L4) in the first direction. Likewise, therefore, the vertical pillars include a first pair of respective ones of the pillars (VP2 and VP1) adjacent one another in the same row and a second pair of respective ones of the pillars (VP1 and VP2) adjacent one another in the same row, with the first pair of the pillars (VP2 and VP1) neighboring the second pair of the pillars (VP1 and VP2) in the first direction X, and the pillars of the first pair being spaced from one another in the first direction X by a distance (CE-to-CE in FIG. 7A) greater than that at which the pillars (VP1 and VP2) of the second pair are spaced from one another (CE-to-CE in FIG. 7B, for example)

Note here also, and as made clear in FIG. 2, the length of an auxiliary line BS1 or BS2 may refer to the distance spanned by the auxiliary line in the first direction X (i.e., the distance end-to-end in the first direction X).

Figure 6:
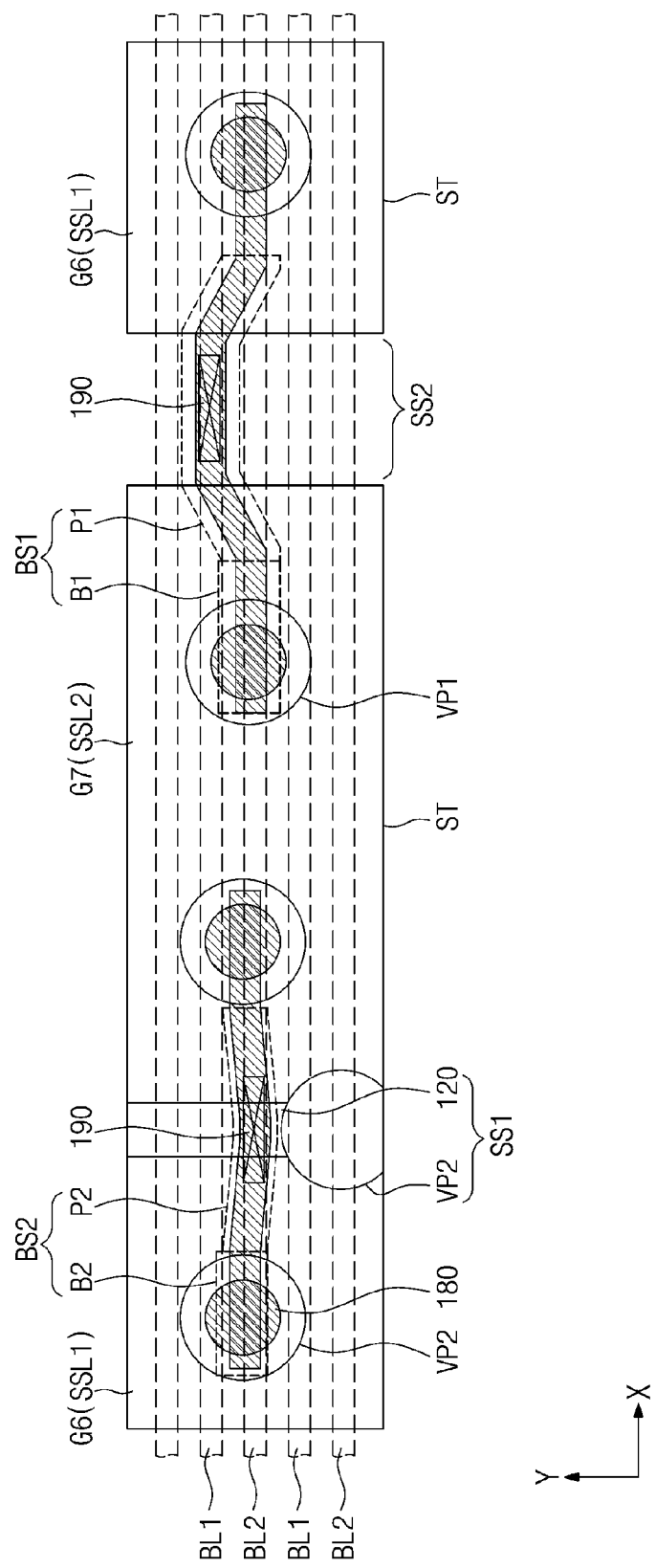
FIG. 6 is a plan view illustrating bit lines and first and second auxiliary lines according to some examples of the inventive concept.
Figure 7A:
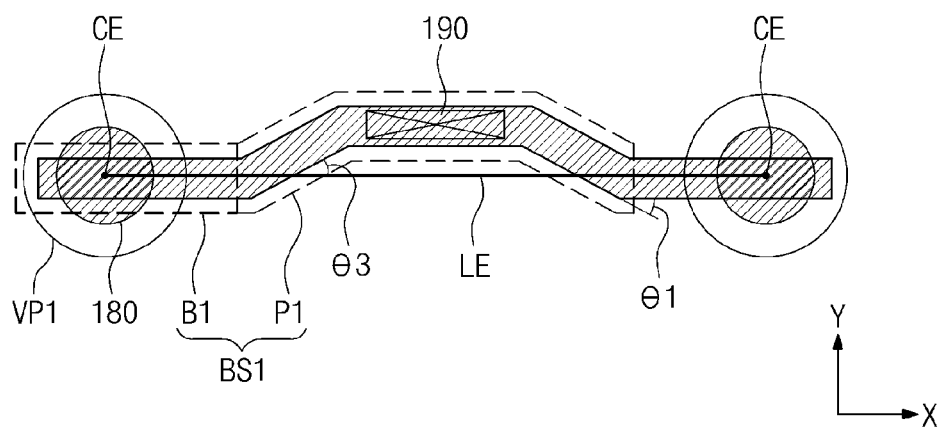
FIGS. 7A and 7B are plan views illustrating first and second auxiliary lines according to some examples of the inventive concept.
Figure 7B:
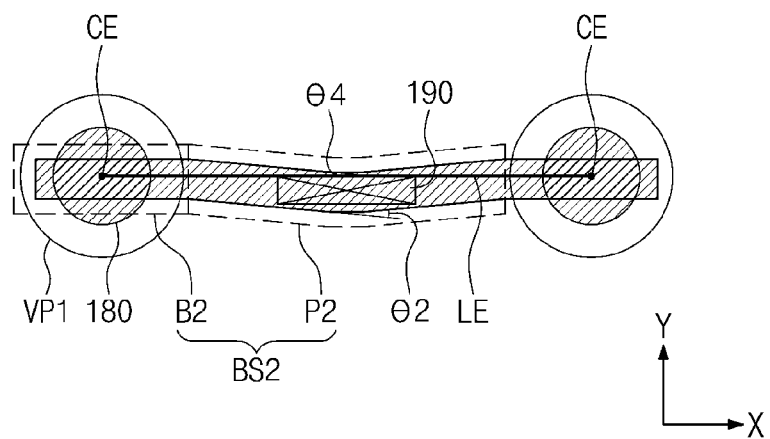

Referring to FIGS. 6, 7A, and 7B, each of the first auxiliary lines BS1 may include first bridges B1, which contact the first contacts 180 respectively, and a first protrusion P1 which is interposed between the first bridges B1 and overlaps the second separation structure SS2. Each of the second auxiliary lines BS2 may include second bridges B2, which contact the first contacts 180 respectively, and a second protrusion P2 which is interposed between the second bridges B2 and overlaps the first separation structure SS1. The first bridges B1 and the second bridges B2 may be parallel to each other.

A first angle $\theta_1$ between the first bridges B1 and the first protrusion P1 in the first auxiliary line BS1 may be greater than a second angle $\theta_2$ between the second bridges B2 and the second protrusion P2 in the second auxiliary line BS2 (i.e., $\theta_1 > \theta_2$). The first protrusion P1 of the first bridge B1 may extend farther in the second direction, compared to the second protrusion P2 of the second bridge B2. Here, the first angle $\theta_1$ and the second angle $\theta_2$ may each be within a range of from 0 degrees to 10 degrees. Also, a third angle $\theta_3$ of the first protrusion P1 with respect to a reference line LE may be greater than a fourth angle $\theta_4$ of the second protrusion P2 with respect to the reference line LE, where the reference line LE passes axial centers CE (i.e., central longitudinal axes) of an adjacent pair of the first and second vertical pillars VP1 and VP2. In some examples, the first angle $\theta_1$ and the third angle $\theta_3$ may be the same, and the second angle $\theta_2$ and the fourth angle $\theta_4$ may be the same.

The protrusion directions (directions in which a protrusion protrudes from the reference line LE) of the first and second protrusions P1 and P2 may be opposite to each other.

Referring back to FIG. 3, second contacts 190 may be provided on the first auxiliary lines BS1 and the second auxiliary lines BS2. The second contacts 190 may be provided on the first protrusions P1 of the first auxiliary lines BS1 and may be overlie the second separation structure SS2. The second contacts 190 may be provided on the second protrusions P2 of the second auxiliary lines BS2 and may overlie with the first separation structure SS1.

Referring to FIGS. 2, 3 and 6, bit lines may be provided on the first and second auxiliary lines BS1 and BS2. The bit lines may run parallel to the first direction X to cross the stacks ST. In certain examples, the bit lines may be spaced apart from each other in the second direction Y by equal distances. The bit lines may include first and second bit lines BL1 and BL2. The first and second bit lines BL1 and BL2 may be alternatingly arranged in the second direction Y. The first bit lines BL1 may be electrically connected to the first auxiliary lines BS1 through the second contacts 190. The second bit lines BL2 may be electrically connected to the second auxiliary lines BS2 through the second contacts 190.

Relative positions of the bit lines BL with respect to the first and second vertical pillars VP1 and VP2 will be described in more detail with reference to FIG. 8.

Figure 8:
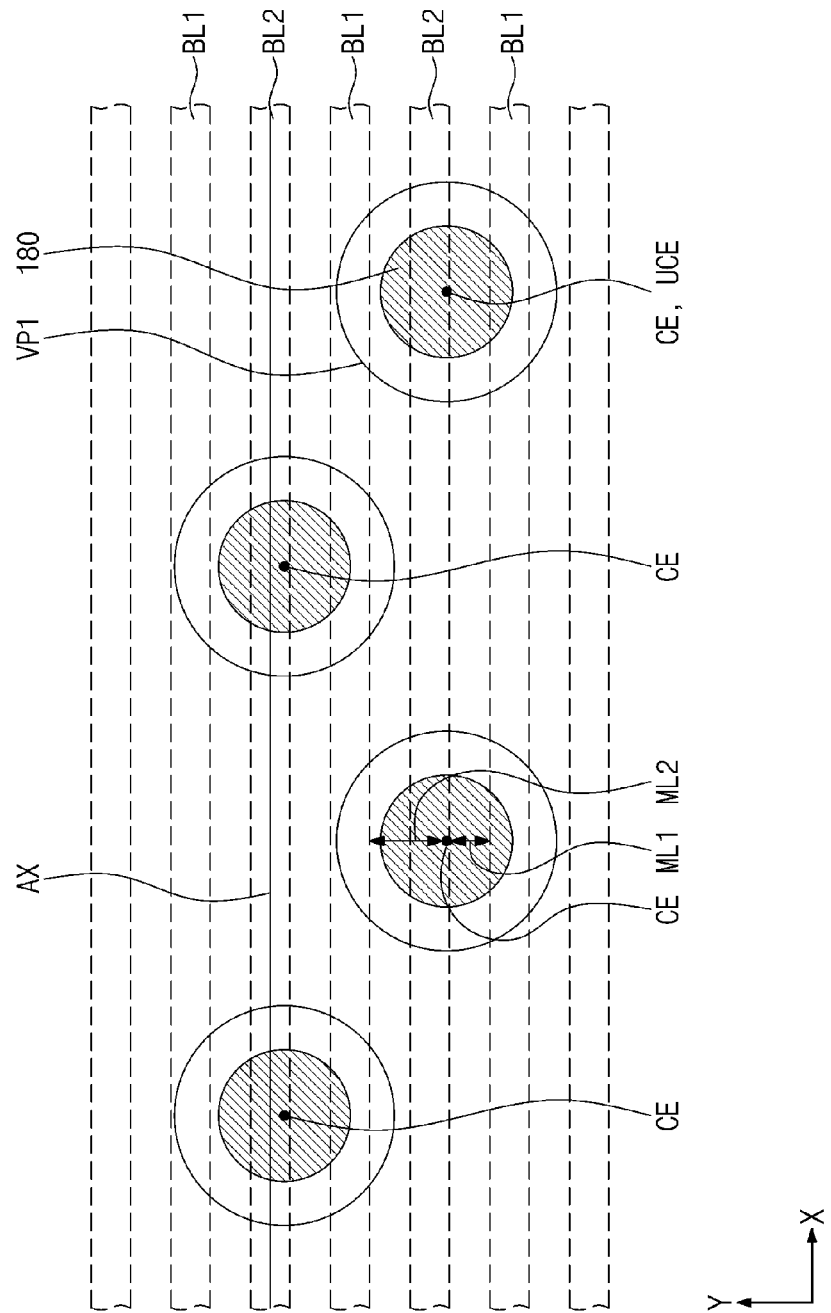
FIG. 8 is a plan view illustrating an arrangement of bit lines with respect to first and second vertical pillars, according to some examples of the inventive concept.

Referring to FIG. 8, three bit lines may be provided to cross each of the first and second vertical pillars VP1 and VP2. For example, in a plan view, at least two of the first bit lines BL1, which are adjacent to each other in the second direction Y, and a second bit line BL2 which is interposed between the first bit lines BL1 may overlap each of the first and second vertical pillars VP1 and VP2. In other words, when viewed in the second direction Y, the first bit lines BL1 may be provided at both sides of the center CE of each of the first and second vertical pillars VP1 and VP2, and the second bit line BL2 may be interposed between the first bit lines BL1.

In a plan view, a first shortest distance ML1 between the center CE of each of the first and second vertical pillars VP1 and VP2 and one of the first bit lines BL1 may be different from a second shortest distance ML2 between the center CE of each of the first and second vertical pillars VP1 and VP2 and another of the first bit lines BL1. In a plan view, each of the first bit lines BL1 may overlap edges of some of the first and second vertical pillars VP1 and VP2 (e.g., constituting odd rows) and may be spaced apart from others of the first and second vertical pillars VP1 and VP2 (e.g., constituting even rows). Thus, the first shortest distance ML1 may be smaller than the second shortest distance ML2.

Each of the second bit lines BL2 may have mirror symmetry about a vertical plane that is parallel to the first direction X and includes a central longitudinal axis AX of the second bit line BL2. The center axis AX of the second bit line BL2 may be spaced apart from the center CE of each of the first and second vertical pillars VP1 and VP2. Also, in a plan view, the center CE of each of the first and second vertical pillars VP1 and VP2 may be substantially coincide with a center UCE of a first contact 180.

The first and second auxiliary lines BS1 and BS2 may be used to allow pairs of the first and second vertical pillars VP1 and VP2 adjacent one another in the first direction X to be connected to different ones of the first and second bit lines BL1 and BL2. If the second auxiliary lines BS2, which are shorter than the first auxiliary lines BS1, were to be completely straight (have a line shape), the first auxiliary lines BS1 would have to bend to a great degree to accomplish this, and this would increase the chance of a short circuit at the bends of the first auxiliary lines BS1. In contrast, according to examples of the inventive concept, the second auxiliary lines BS2 have bends, which makes it is possible to keep the extent of the bending of the first auxiliary lines BS1 to a minimum.

Figure 9:
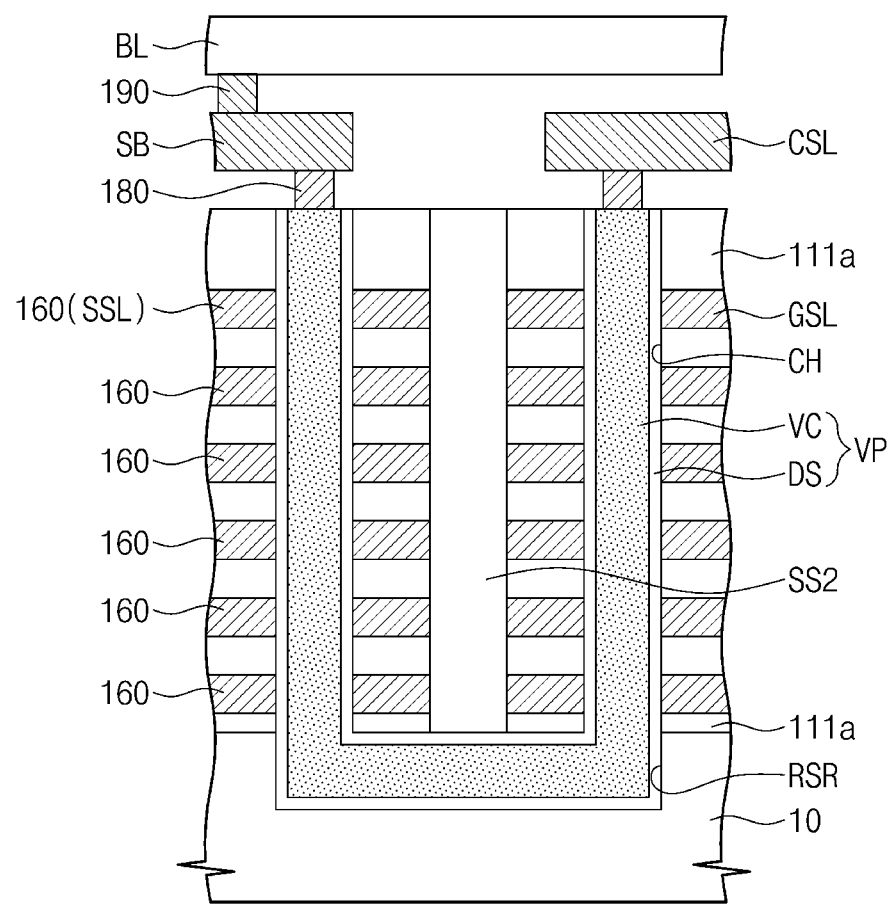
FIG. 9 is a sectional view illustrating a semiconductor memory device according to some examples of the inventive concept.

FIG. 9 is a sectional view illustrating a semiconductor memory device according to some other examples of the inventive concept. For concise description, a previously described element may be identified by a similar or identical reference number without repeating an overlapping description thereof.

Referring to FIG. 9, gate electrodes G1, G2, G3, G4, G5, G6 may be spaced apart from each other in the first direction X by the second separation structure SS2. The uppermost one G6 of the gate electrodes G1, G2, G3, G4, G5, G6 may include a string selection line SSL and a ground selection line GSL that are spaced apart from each other in the first direction X by the second separation structure SS2. A plurality of channel holes CH may extend through the gate electrodes G1, G2, G3, G4, G5, G6. Recesses RSR may be formed in the substrate 10, and each pair of the vertical holes CH spaced apart from each other in the first direction X may be connected to each other through a corresponding one of the recesses RSR. In other words, one of the channel holes CH extending through the string selection line SSL may lead to another channel hole CH adjacent thereto and extending through the ground selection line GSL. Vertical pillars VP may be provided in the channel holes CH, respectively.

Each vertical pillar VP may include the charge storing structure DS and the vertical channel portion VC that are provided in each channel hole CH. The first contact 180, the auxiliary line BS, and the second contact 190 may be sequentially provided on each of the vertical pillars VP extending through the string selection line SSL to provide a current path to the bit line BL. The vertical pillars VP extending through the ground selection line GSL may be connected to the common source line CSL through the first contacts 180 thereon.

FIGS. 10A-14C illustrate some examples of a method of fabricating a semiconductor memory device according to the inventive concept. FIGS. 10A to 14A are plan views. FIGS. 10B to 14B are sectional views taken along line I-I' of FIGS. 10A to 14A, respectively. FIGS. 10C to 14C are sectional views taken along line II-II' of FIGS. 10A to 14A, respectively.

Figure 10B:
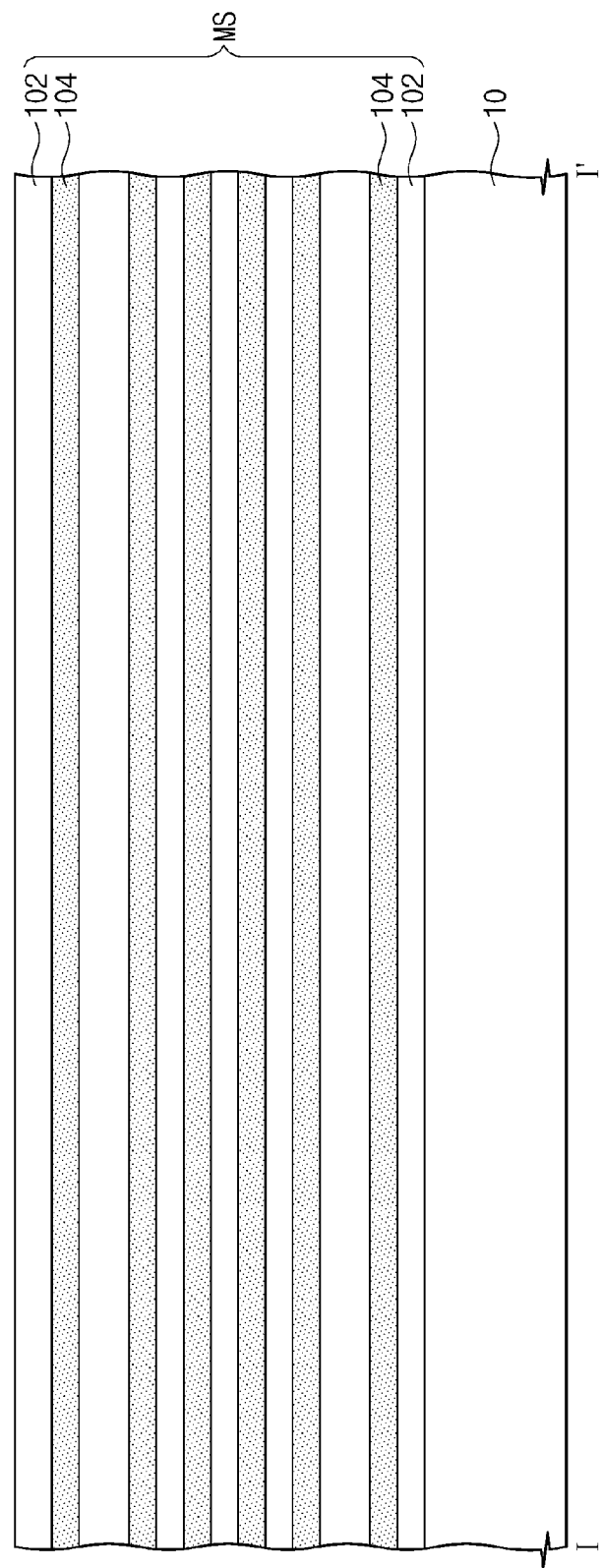
FIGS. 10B, 11B, 12B, 13B and 14B are sectional views, which are taken along line I-I' of FIGS. 10A to 14A, respectively, and illustrate a method of fabricating a semiconductor memory device according to some examples of the inventive concept.
Figure 10C:
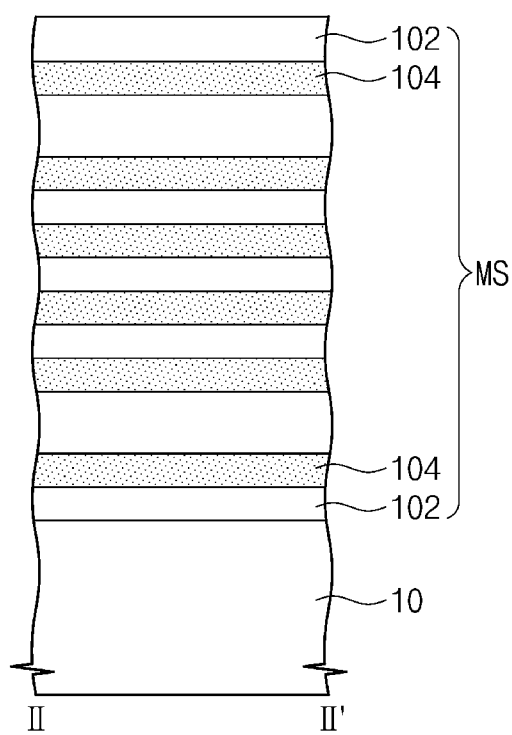
FIGS. 10C, 11C, 12C, 13C and 14C are sectional views, which are taken along line II-II' of FIGS. 10A to 14A, respectively, and illustrate a method of fabricating a semiconductor memory device according to some examples of the inventive concept.

Referring to FIGS. 10A to 10C, a mold structure MS may be formed on a substrate 10. The substrate 10 may be a silicon substrate, a silicon-germanium substrate, a germanium substrate, or a single-crystalline epitaxial layer grown on a single-crystalline silicon substrate.

The mold structure MS may include insulating layers 102 and sacrificial layers 104, which are alternatingly stacked on the substrate 10. The insulating layers 102 may include a material whose etch rate is lower than that of the sacrificial layers 104 in a subsequent etching process for removing the sacrificial layers 104. For example, the insulating layers 102 may be formed of or include silicon oxide, and the sacrificial layers 104 may be formed of or include silicon nitride or silicon oxynitride. The insulating layers 102 may be formed of the same material, and the sacrificial layers 104 may also be formed of the same material. Although not illustrated in the drawings, a buffer insulating layer (not shown) may be interposed between the substrate 10 and the mold structure MS.

Figure 11A:
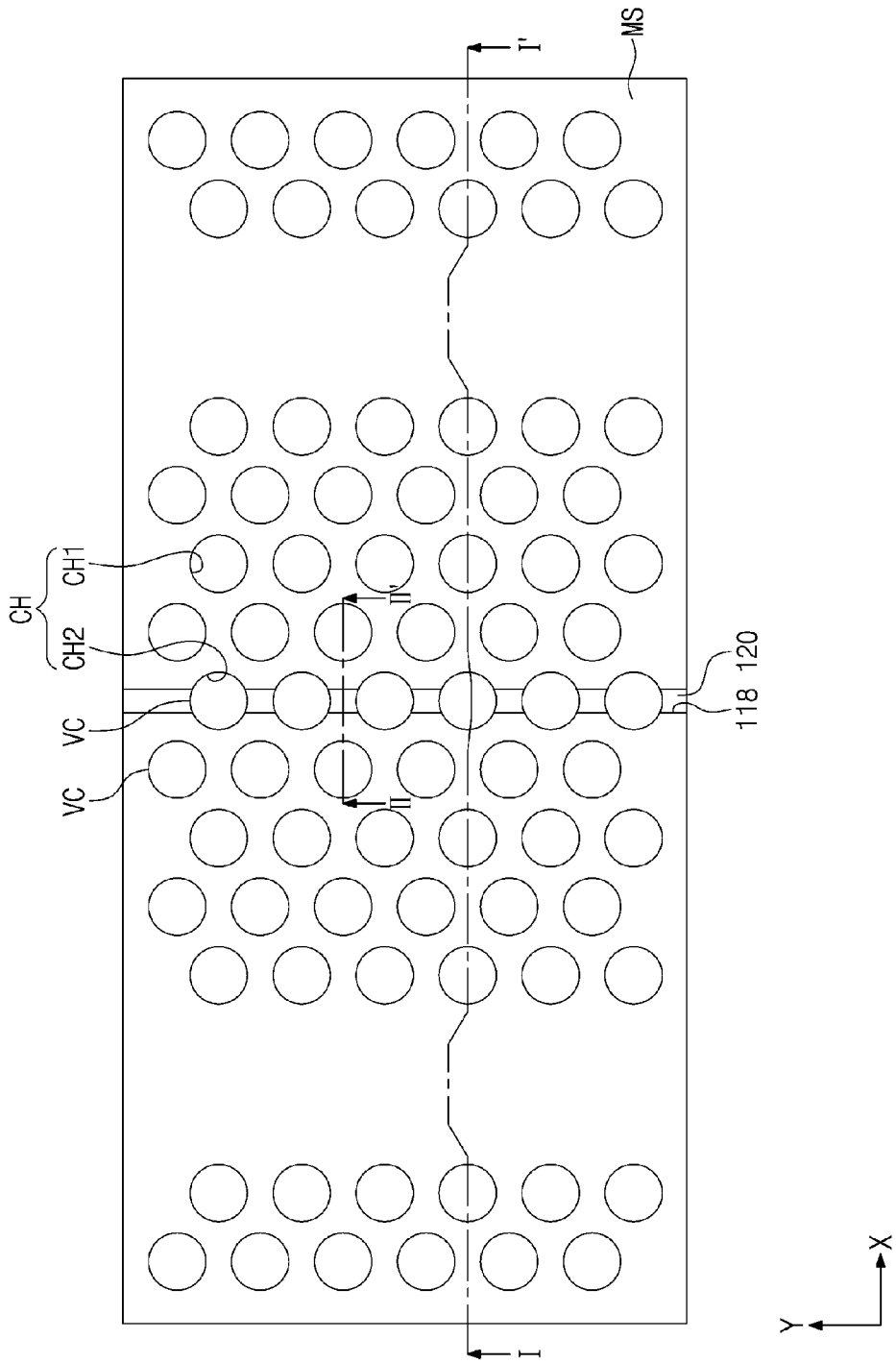
Figure 11B:
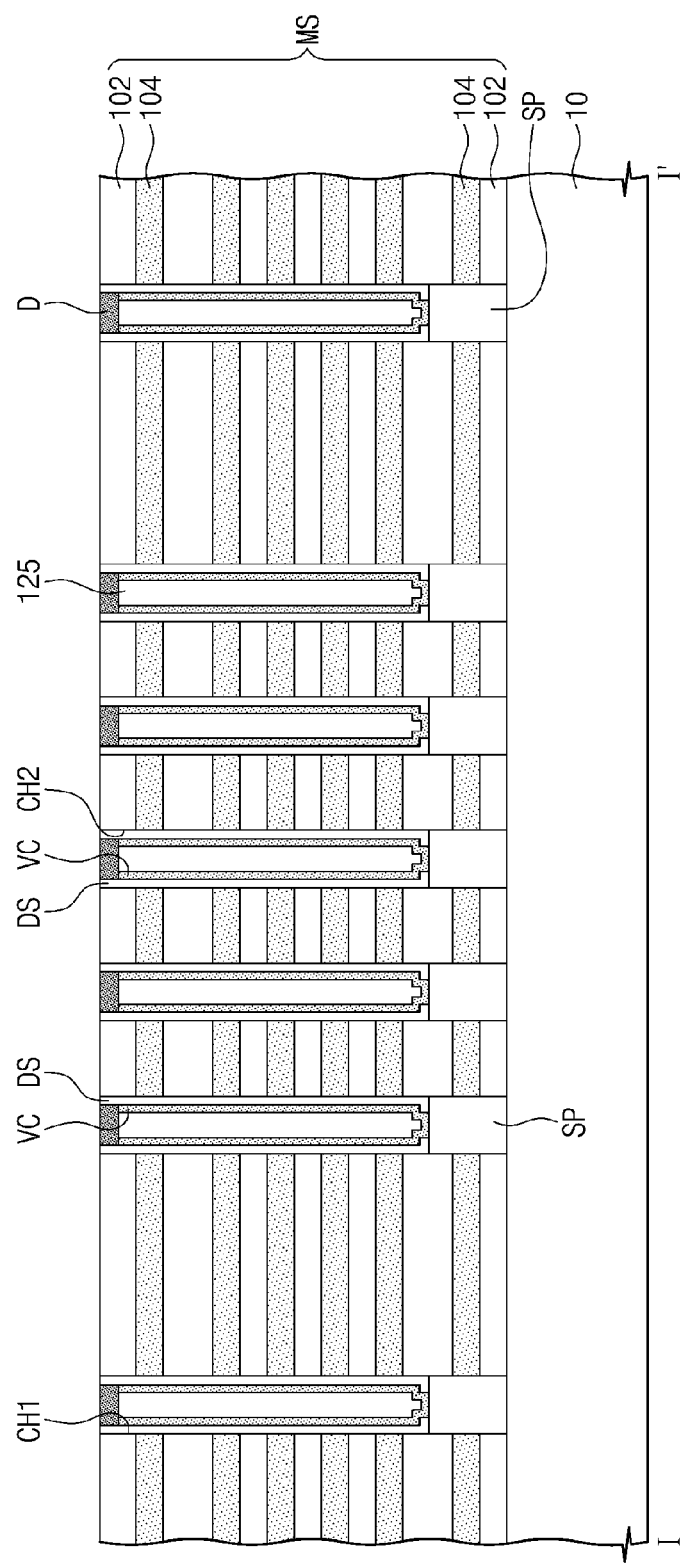
Figure 11C:
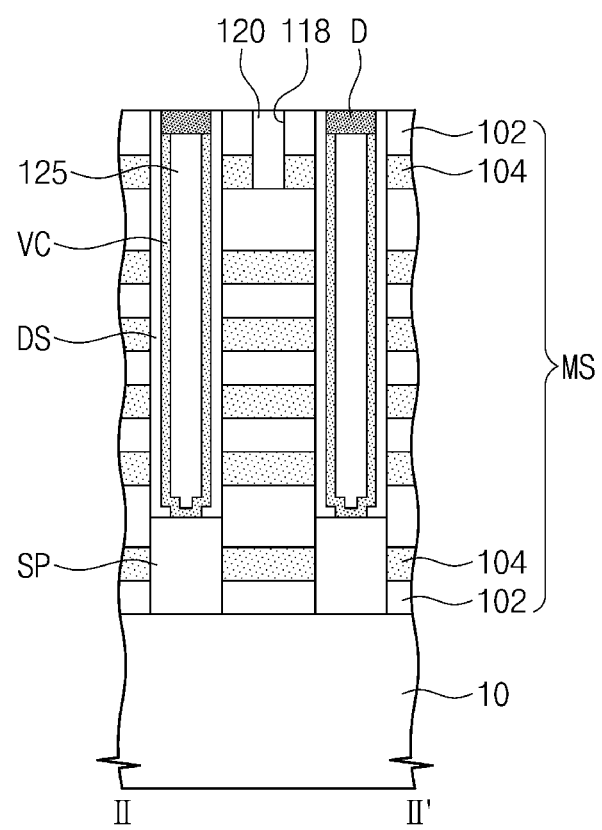

Referring to FIGS. 11A to 11C, the uppermost layer of the insulating layers 102 and the uppermost layer of the sacrificial layers 104 may be patterned to form a separation trench 118 in the mold structure MS. The separation trench 118 may be formed to cut and divide the uppermost layer of the insulating and sacrificial layers 102 and 104 in a first direction X. For example, the separation trench 118 may be formed to expose the second uppermost layer of the insulating layers 102 under the uppermost layer of the sacrificial layers 104. In some examples, the separation trench 118 may be formed using an anisotropic etching process (e.g., a dry etching process).

An insulating separation layer 120 may be formed in the separation trench 118. The formation of the insulating separation layer 120 may include forming an insulating layer to fill the separation trench 118 and performing a planarization process on the insulating layer. The insulating separation layer 120 may be formed to extend in a second direction Y crossing the first direction X. The insulating separation layer 120 may be formed of or include, for example, a silicon oxide layer.

The mold structure MS may be etched to form channel holes CH exposing the substrate 10. For example, the formation of the channel holes CH may include forming a mask pattern (not shown) on the uppermost layer of the insulating layers 102 and anisotropically etching the mold structure MS using a mask pattern as an etch mask. As a result of the anisotropic etching, the channel holes CH may be formed to have a substantially uniform width, when measured in a vertical direction normal to the top surface of the substrate 10. Alternatively, the channel holes CH may be formed to have a width varying in the vertical direction. For example, each of the channel holes CH may have sides that are inclined (i.e., oblique) relative to the top surface of the substrate 10. The etching may be performed in an over-etch manner, and thus, parts of the top portion of the substrate 10 may be recessed. In a plan view, each of the channel holes CH may have the shape of a circle, an ellipse, or a polygon.

The channel holes CH may include first channel holes CH1 and second channel holes CH2. The first channel holes CH1 may be formed to be spaced apart from the insulating separation layer 120. The first channel holes CH1 may be spaced apart from each other in the first and second directions X and Y. The second channel holes CH2 may be formed on the insulating separation layer 120. The second channel holes CH2 may be arranged in a plurality of columns, each of which is parallel to the second direction Y.

Semiconductor pillars SP may be formed in the channel holes CH, respectively. The semiconductor pillars SP may be formed by a selective epitaxial growth process, in which the substrate 10 exposed by the channel holes CH is used as a seed layer. In this case, the semiconductor pillar SP may be formed of or include an intrinsic or p-type semiconductor material, whose crystalline structure is similar to that of the substrate 10, but the inventive concept is not be limited thereto.

Charge storing structures DS may be formed along the sides of the channel holes CH. Each of the charge storing structures DS may be formed to cover a surface defining the sides of a channel hole CH and a portion of the top surface of the substrate 10 exposed by the channel hole CH. More specifically, the forming of the charge storing structure DS may include forming a first insulating layer, a second insulating layer, and a third insulating layer to sequentially cover inner surfaces delimiting the channel holes CH, and then, performing a dry etching process on the first to third insulating layers to partially expose the top surface of the substrate 10.

Referring back to FIG. 5A, each of the charge storing structure DS may include the blocking insulating layer BLL, the charge storing layer CTL, and the tunnel insulating layer TL, which are sequentially stacked on the sidewall of the channel hole CH. For example, the blocking insulating layer BLL may be at least one of a silicon oxide layer and a high-k dielectric layer (e.g., $Al_2O_3$ or $HfO_2$), the charge storing layer CTL may be a silicon nitride layer, and the tunnel insulating layer TL may be at least one of a silicon oxynitride layer and a high-k dielectric layer (e.g., $Al_2O_3$ or $HfO_2$).

A vertical channel portion VC may be formed in each channel hole CH provided with the charge storing structure DS. The vertical channel portion VC may be formed to conformally cover an inner surface of the tunnel insulating layer TL and the top surface of the substrate 10 exposed by the charge storing structure DS. The vertical channel portion VC may be formed of or include a semiconductor material. For example, the vertical channel portion VC may be formed of or include at least one of a polysilicon layer, an organic semiconductor layer, and carbon nanostructures.

A gap-fill layer 125 may be formed in the channel holes CH provided with the vertical channel portions VC. The gap-fill layer 125 may be formed to completely fill the channel hole CH provided with the vertical channel portion VC. The gap-fill layer 125 may be formed using a spin-on-glass (SOG) method. The gap-fill layer 125 may be formed of or include at least one of insulating material (e.g., silicon oxide and/or silicon nitride). Before the forming of the gap-fill layer 125, the vertical channel portions VC may be further treated by a hydrogen annealing process (e.g., by a thermal treatment process to be performed under a gas ambient containing hydrogen or deuterium). Crystal defects in the vertical channel portion VC may be cured by the hydrogen annealing process.

Pads D may be formed on the vertical channel portions VC. In some examples, the forming of the pads D may include etching upper portions of the charge storing structures DS, the vertical channel portions VC, and the gap-fill layer 125 to form recesses, and then, filling the recesses with a conductive material. In certain examples, the pads D may be formed by doping upper portions of the vertical channel portions VC with impurities, and in this case, the pads D may have a different conductivity type from that of the vertical channel portion VC.

Figure 12A:
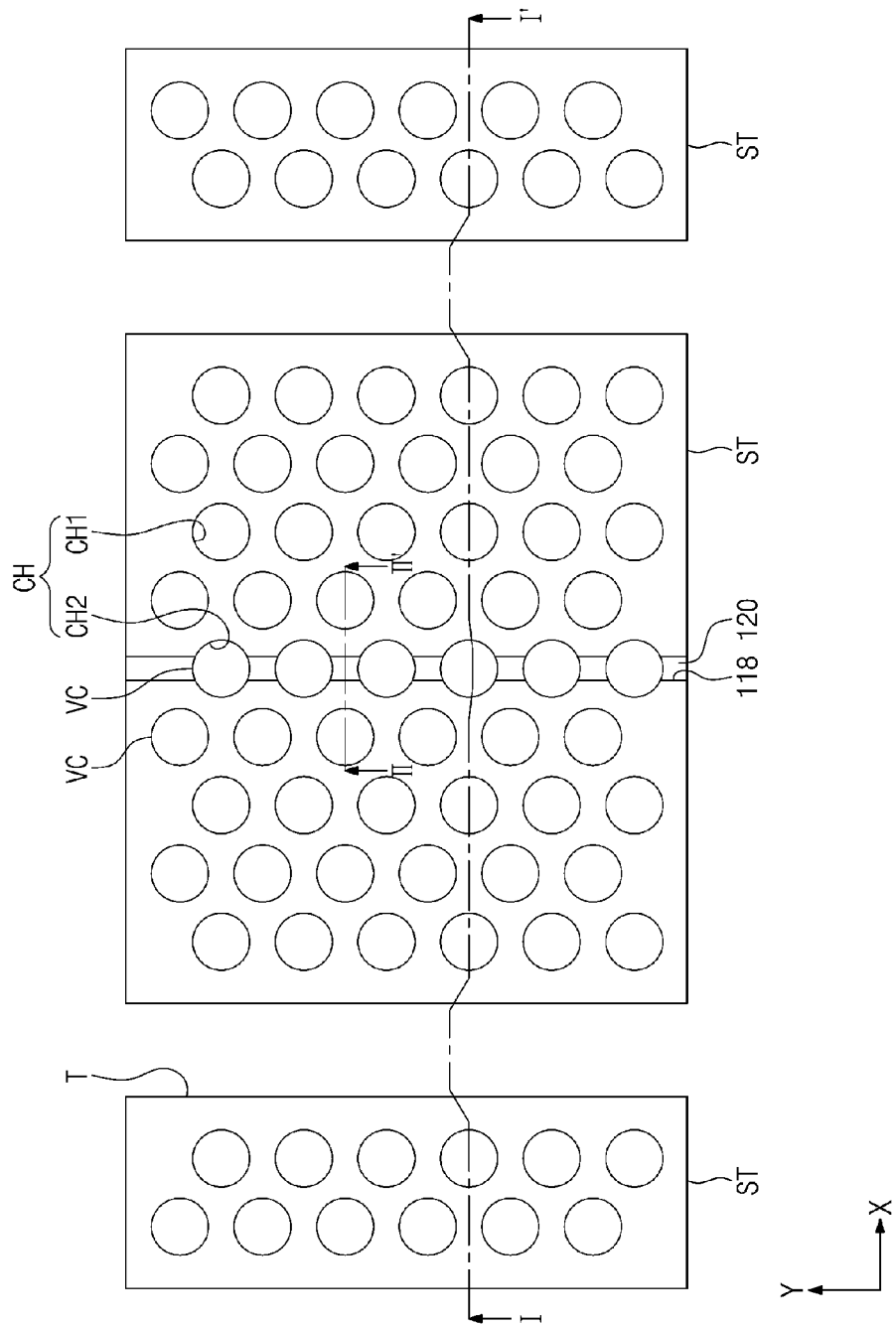
Figure 12B:
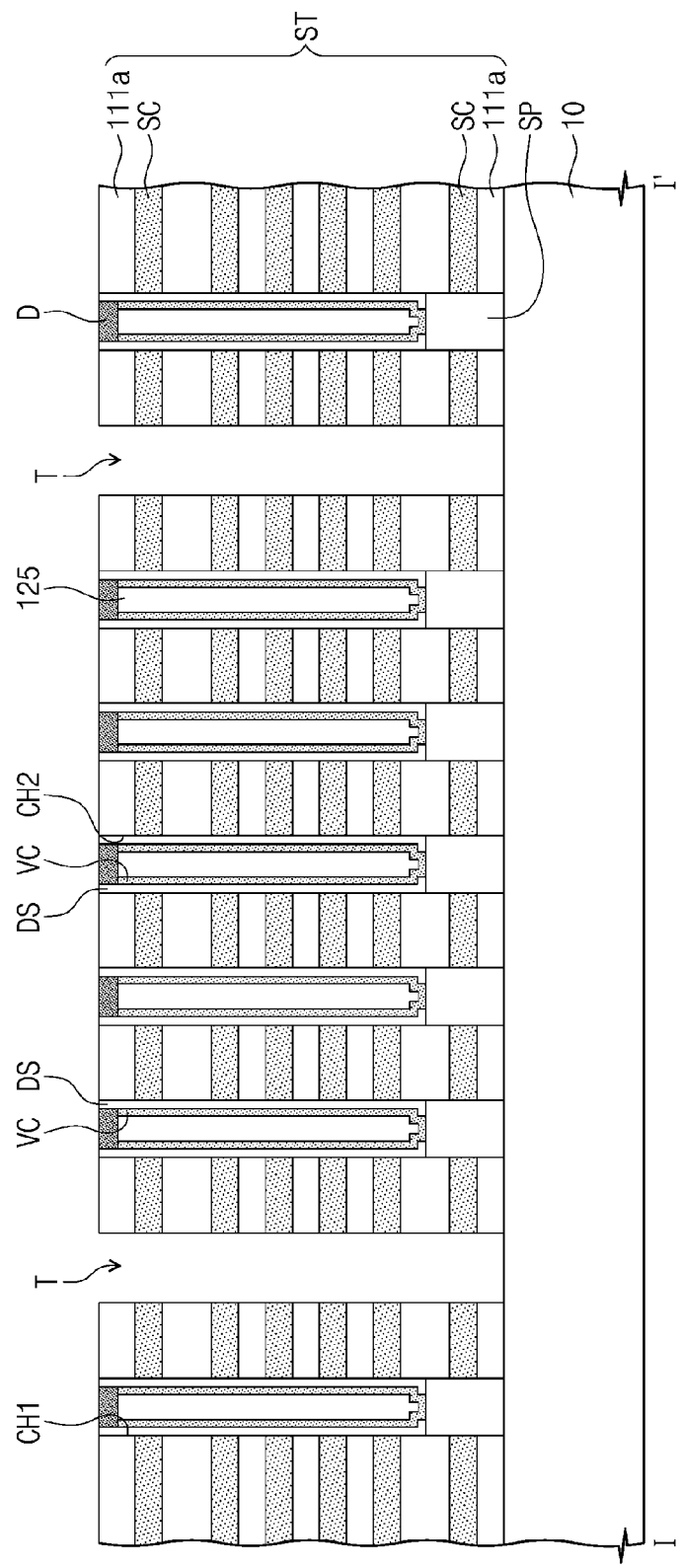
Figure 12C:
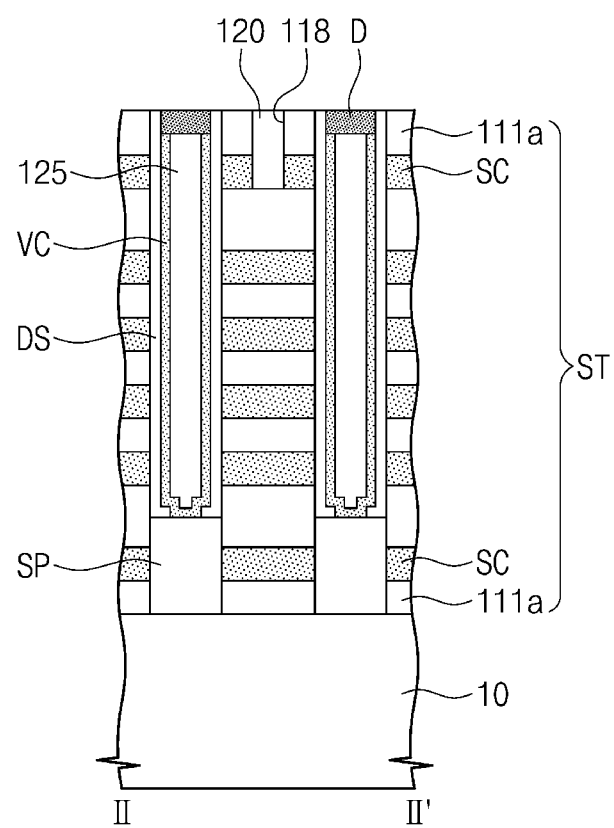

Referring to FIGS. 12A to 12C, an anisotropic etching process may be performed on the mold structure MS to form trenches T. For example, the forming of the trenches T may include forming a mask pattern (not shown) on the mold structure MS and anisotropically etching the mold structure MS, using the mask pattern as an etch mask, to expose the top surface of the substrate 10. The trenches T may be formed to extend in the second direction Y. For example, the trenches T may be formed to have a line or rectangular shape extending lengthwise in the second direction Y. As a result of the forming of the trenches T, a plurality of stacks ST spaced apart from each other in the first direction X may be formed on the substrate 10.

Each of the stacks ST may include insulating patterns 111a and sacrificial patterns SC alternatingly stacked on the substrate 10. The insulating patterns 111a may be formed by patterning the insulating layers 102, and the sacrificial patterns SC may be formed by patterning the sacrificial layers 104. Sides of the stacks ST may be exposed through the trenches T.

Figure 13B:
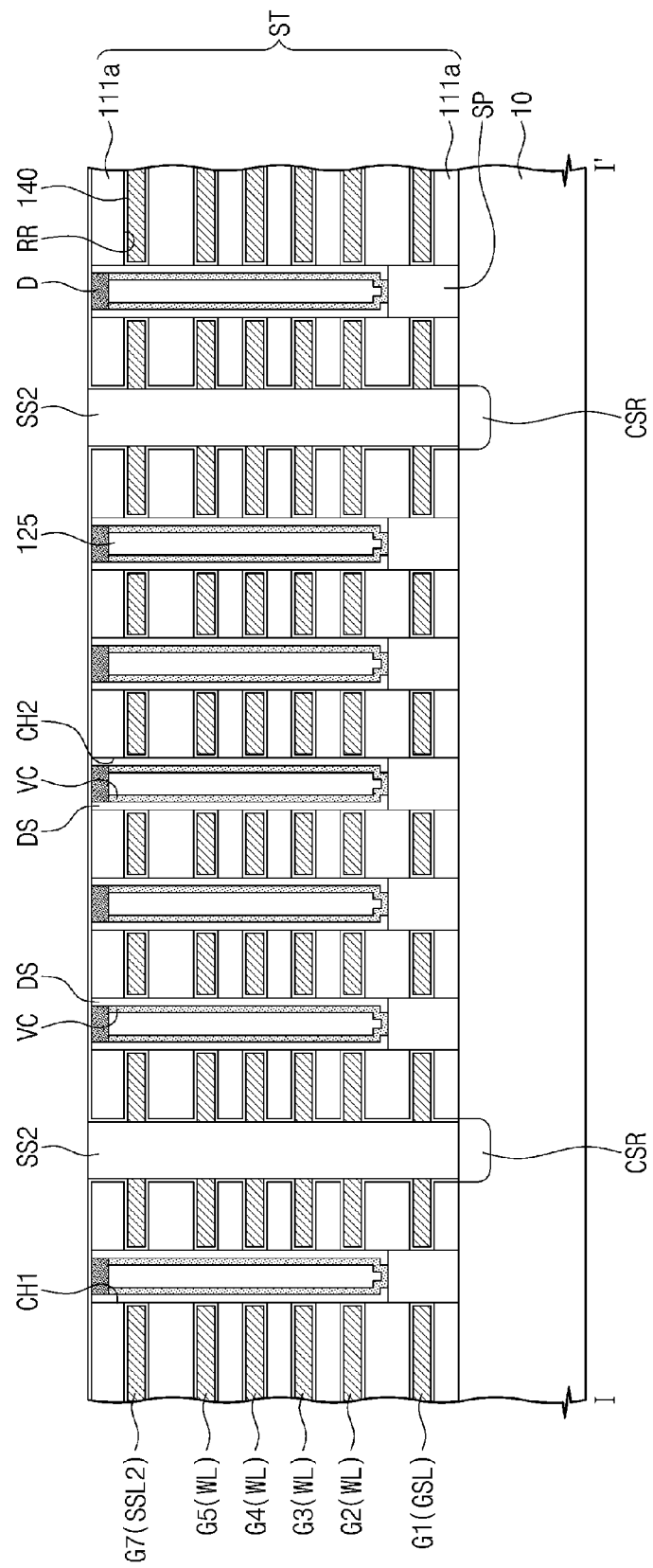
Figure 13C:
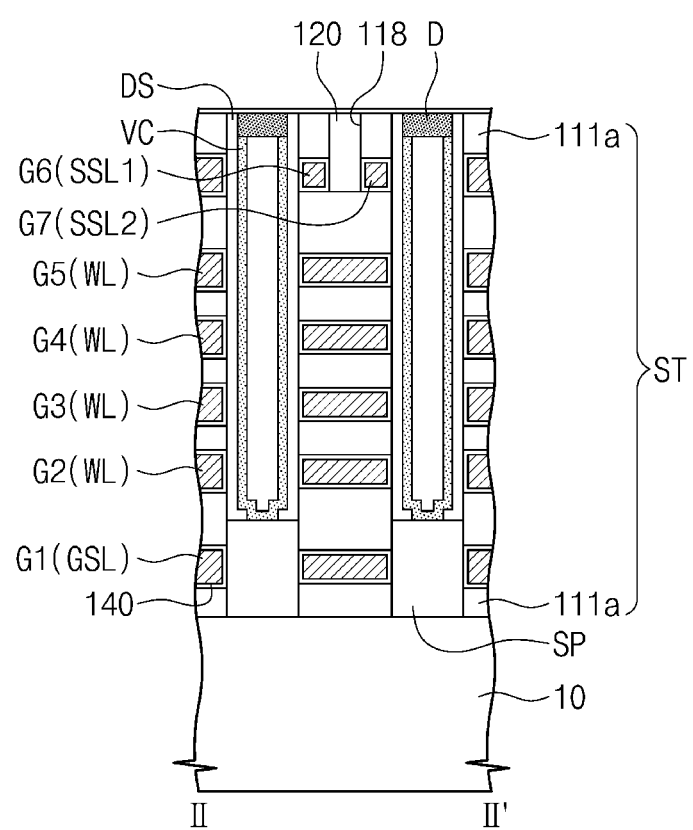

Referring to FIGS. 13A to 13C, the sacrificial patterns SC exposed by the trenches T may be removed to form recesses RR between the insulating patterns 111a. For example, the recesses RR may be formed by removing the sacrificial patterns SC through a wet etching process and/or an isotropic dry etching process. In the case where the insulating patterns 111a are formed to have an etch selectivity with respect to the sacrificial patterns SC, it is possible to prevent the insulating patterns 111a from being removed when the sacrificial patterns SC are removed. The removal of the sacrificial patterns SC may be performed to prevent the insulating separation layer 120 from being removed. For example, in the case where the sacrificial patterns SC are silicon nitride layers and the insulating patterns 111a and the insulating separation layer 120 are silicon oxide layers, the etching process may be performed using an etching solution containing phosphoric acid.

The recesses RR may be laterally extended from the trenches T to expose top and bottom surfaces of the insulating patterns 111a. Furthermore, the recesses RR may be formed to expose the top and bottom surfaces of the insulating patterns 111a and portions of the outer side surfaces of the charge storing structures DS.

A horizontal insulating layer 140 may be formed to cover the resulting structure having the recesses RR and the trenches T therein. For example, the horizontal insulating layer 140 may conformally cover the exposed top and bottom surfaces of the insulating patterns 111a, the exposed portion of the outer side surfaces of the charge storing structures DS, and the top surface of the substrate 10. The horizontal insulating layer 140 may be formed using a deposition process with a good step coverage property. For example, the horizontal insulating layer 140 may be formed using a chemical vapor deposition (CVD) or an atomic layer deposition (ALD) process. The horizontal insulating layer 140 may be formed of or include at least one of a silicon oxide layer (e.g., $SiO_2$) and a high-k dielectric layer (e.g., $Al_2O_3$ or $HfO_2$).

A conductive material serving as first to seventh gate electrodes G1-G7 may be formed in the recesses RR. The forming of the first to seventh gate electrodes G1-G7 may include forming a conductive layer (not shown) to fill the recesses RR and performing an etching process to remove the conductive layer from the trenches T. As the result of the etching process, the conductive layer may remain in the recesses RR, thereby serving as the first to seventh gate electrodes G1-G7.

After the forming of the first to seventh gate electrodes G1-G7, an impurity region CSR may be formed in the substrate 10 exposed by the trenches T. The impurity region CSR may be formed by an ion implantation process. In some examples, the impurity region CSR may be a region doped to have a conductivity type different from that of the substrate 10.

Second separation structures SS2 may be formed in the trenches T. The second separation structures SS2 may be formed by filling the trenches T with an insulating material (e.g., silicon oxide or silicon nitride). Although not illustrated in the drawings, in certain examples, the second separation structures SS2 may be formed to include a conductive layer (not shown) that is electrically connected to the impurity region CSR.

Figure 14A:
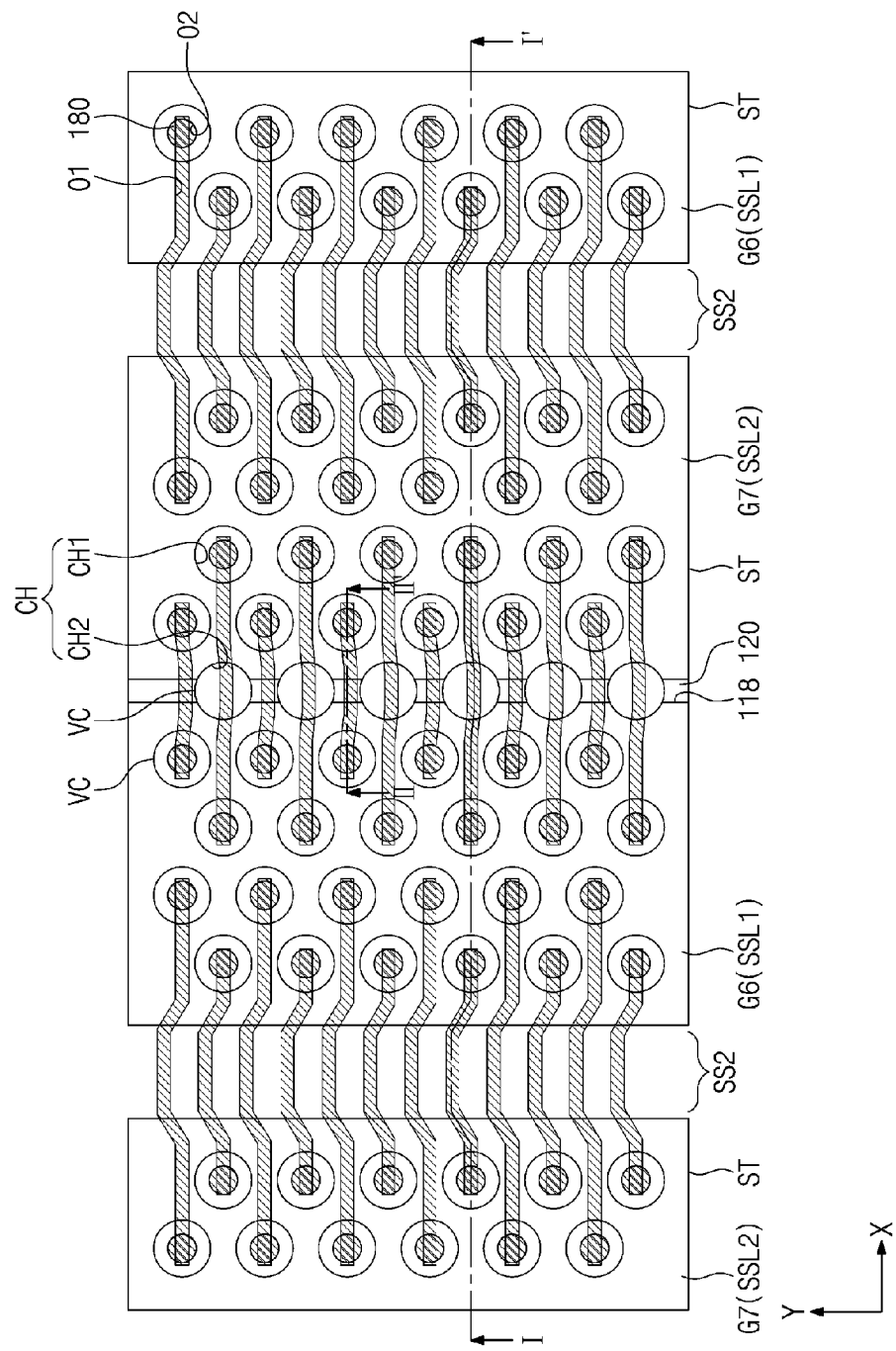
Figure 14B:
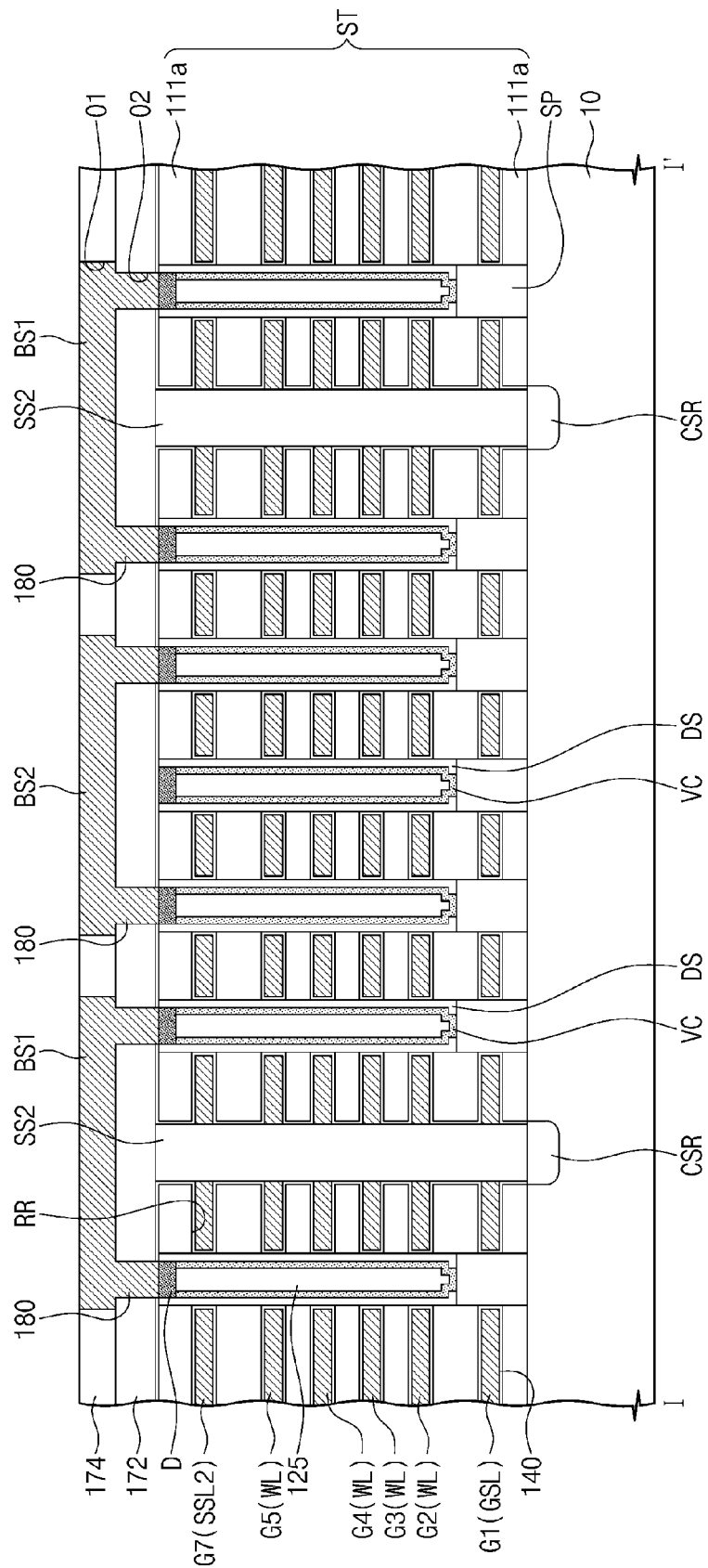
Figure 14C:
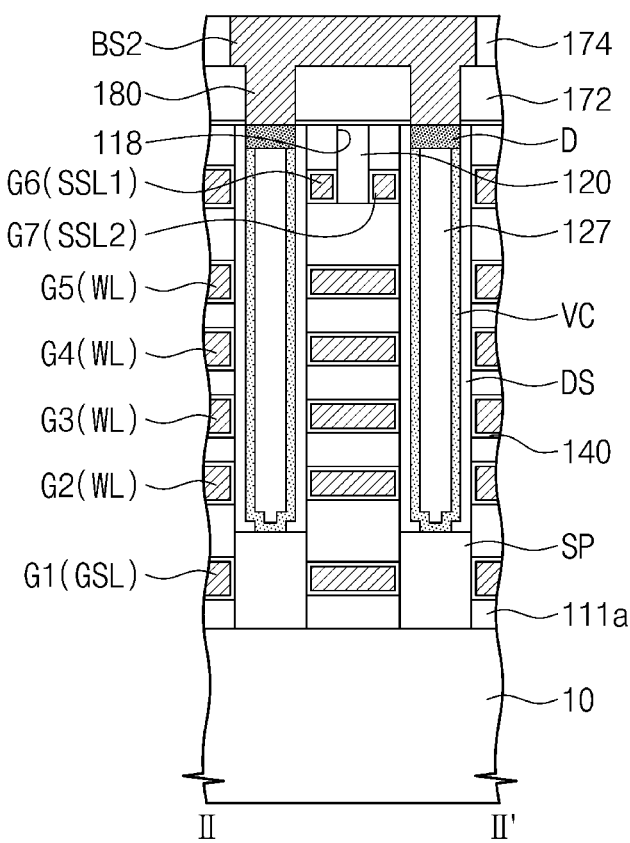

Referring to FIGS. 14A to 14C, a first insulating layer 172 and a second insulating layer 174 may be sequentially formed on the stacks ST provided with the second separation structures SS2. Each of the first and second insulating layers 172 and 174 may be formed of or include, for example, a silicon oxide layer or a silicon nitride layer.

First contacts 180 may be formed on the pads D, respectively, and auxiliary lines BS1 and BS2 may be formed on the first contacts 180. Each of the auxiliary lines BS1 and BS2 may be formed to connect a pair of the first contacts 180 to each other.

For example, the forming of the first contacts 180 and the auxiliary lines BS1 and BS2 may include performing a patterning process on the second insulating layer 174 to form first openings O1 in the second insulating layer 174, forming a mask pattern (not shown) in the first openings O1 to partially fill the first openings O1, patterning the first insulating layer 172 exposed by the mask pattern to form second openings O2 exposing the pads D, removing the mask pattern, and then, filling the first and second openings O1 and O2 with a conductive material. Here, the auxiliary lines BS1 and BS2 may be formed in the first openings O1, and the first contacts 180 may be formed in the second openings O2.

Alternatively, the auxiliary lines BS1 and BS2 may be formed after the forming of the first contacts 180. The first contacts 180 and the auxiliary lines BS1 and BS2 may be formed of or include at least one conductive material (e.g., tungsten (W), copper, or aluminum (Al)).

Second contacts 190 may be formed on the auxiliary lines BS1 and BS2, respectively. Subsequently, first and second bit lines BL1 and BL2, each of which connects some of the second contacts 190 to each other, may be formed on the second contacts 190.

An auxiliary line is provided to cross a separation structure horizontally separating word lines from each other. According to some examples of the inventive concept, it is possible to reduce an extent of bending of the auxiliary line, and thus, the auxiliary line is prevented from being cut when the auxiliary line is patterned. This may make it possible to improve reliability of a semiconductor device.

Although examples of the inventive concept have been particularly shown and described, it will be understood by one of ordinary skill in the art that variations in form and detail may be made to such examples without departing from the spirit and scope of the inventive concept as defined by the attached claims.

What is claimed is:

1. A semiconductor memory device, comprising:
    a substrate;
    stacks on the substrate, the stacks comprising word lines disposed one on another and first and second string selection lines laterally spaced apart from each other;
    vertical pillars passing through the stacks; and
    first bit lines and second bit lines extending longitudinally in a first direction, wherein the first bit lines are alternatingly disposed with the second bit lines in a second direction crossing the first direction,
    with respect to each of the vertical pillars, at least two of the first bit lines which are adjacent to each other in the second direction, and each of the second bit lines which is interposed between adjacent ones of said at least two of the first bit lines overlap the vertical pillar in a plan view of the vertical pillars and bit lines, and
    a shortest distance in the second direction between an axial center of each of the vertical pillars and one of the first bit lines overlapping the vertical pillar is different from a shortest distance in the second direction between the axial center of the vertical pillar and another of the first bit lines overlapping the vertical pillar.

2. The device of claim 1, further comprising:
    a first separation structure extending in the second direction between the stacks; and
    a second separation structure extending in the second direction between the first and second string selection lines.

3. The device of claim 2, wherein the vertical pillars comprise:
    first vertical pillars passing through the stacks, the first vertical pillars electrically coupled with the first string selection lines; and
    second vertical pillars passing through the stacks, the second vertical pillars electrically coupled with the second string selection lines,
    wherein the semiconductor memory device further comprises:
    first auxiliary lines extending across the first separation structure, each of the first auxiliary lines electrically connecting one of the first vertical pillars and one of the second vertical pillars; and
    second auxiliary lines extending across the second separation structure, each of the second auxiliary lines electrically connecting one of the first vertical pillars and one of the second vertical pillars.

4. The device of claim 3, wherein the first auxiliary lines are arrayed in the second direction,
    the second auxiliary lines are arrayed in the second direction,
    the first bit lines are connected to the first auxiliary lines, respectively, and
    the second bit lines are connected to the second auxiliary lines, respectively.

5. The device of claim 3, wherein the first auxiliary lines have first protrusions, which protrude in the second direction and overlie the first separation structure,
    the second auxiliary lines comprise second protrusions which overlie the second separation structure, and
    the first protrusions protrude in a direction opposite to the second protrusions.

6. The device of claim 3, wherein each of the first auxiliary lines comprises first bridges disposed on the first vertical pillars, respectively, and a first protrusion interposed between the first bridges, and
    each of the second auxiliary lines comprises second bridges disposed on the second vertical pillars, respectively, and a second protrusion interposed between the second bridges,
    wherein the first protrusion protrudes in the second direction,
    the second protrusion protrudes in a direction opposite to the first protrusion, and
    an angle subtended by the first bridges and the first protrusion is different from an angle subtended by the second bridges and the second protrusion.

7. The device of claim 6, wherein the angle subtended by the first bridges and the first protrusion is greater than the angle subtended by the second bridges and the second protrusion.

8. The device of claim 1, further comprising dummy vertical pillars interposed between the first and second string selection lines and passing through one of the stacks.

9. The device of claim 1, further comprising lower contacts disposed on the vertical pillars, respectively,
    wherein an axial center of each of the vertical pillars coincides with that of the lower contact disposed thereon, in a plan view of the lower contacts and vertical pillars.

10. The device of claim 1, wherein each of the second bit lines has mirror symmetry about a plane that is parallel to the first direction and is spaced apart from the axial center of the vertical pillar overlapped by the second bit line.

11. A semiconductor memory device, comprising:
    a substrate;
    stacks on the substrate, the stacks comprising word lines disposed one on another and first and second string selection lines laterally spaced apart from each other in a first direction;
    a first separation structure extending in a second direction and comprising an insulating separation layer between the first and second string selection lines, and dummy vertical pillars passing through the insulating separation layer and one of the stacks;
    a second separation structure extending in the second direction between the stacks;
    active vertical pillars passing through the stacks;
    first auxiliary lines crossing the first separation structure, wherein each of the first auxiliary lines has a first protrusion and electrically connects respective ones of the vertical pillars which are adjacent to each other in the first direction; and
    second auxiliary lines crossing the second separation structure, wherein each of the second auxiliary lines has a second protrusion and electrically connects respective ones of the vertical pillars which are adjacent to each other in the first direction,
    wherein the first protrusion of each of the first auxiliary lines subtends an angle with an associated reference line passing through axial centers of the vertical pillars electrically connected by the first auxiliary line, and the second protrusion of each of the second auxiliary lines subtends an angle with an associated reference line passing through axial centers of the vertical pillars electrically connected by the second auxiliary line, in a plan view of the first and second auxiliary lines and vertical pillars, and the angle subtended by the first protrusion and the reference line associated therewith is different from the angle subtended by the second protrusion and the reference line associated therewith.

12. The device of claim 11, wherein the first protrusion protrudes in a direction opposite to the second protrusion.

13. The device of claim 11, wherein the first auxiliary lines are alternatingly disposed with the second auxiliary lines in the first direction, and a shortest one of lengths of the first auxiliary lines is greater than a shortest one of the lengths of the second auxiliary lines.

14. The device of claim 11, wherein the first protrusion of each of the first auxiliary lines overlaps the second separation structure, and the second protrusion of each of the second auxiliary lines overlaps the first separation structure.

15. The device of claim 11, further comprising first bit lines and second bit lines each extending longitudinally in the first direction, the first bit lines being alternatingly disposed with the second bit lines in the second direction, wherein with respect to each of the vertical pillars, at least two of the first bit lines which are adjacent to each other in the second direction, and each of the second bit lines which is interposed between adjacent ones of said at least two of the first bit lines overlap the vertical pillar in a plan view of the vertical pillars and bit lines.

16. A semiconductor memory device, comprising:
a substrate;
layers stacked one above another on the substrate and comprising a plurality of word lines;
pillars extending vertically through the layers and arrayed in rows and columns extending in first and second directions, respectively, the pillars including a first pair of respective active ones of the pillars adjacent one another in the same row and a second pair of respective active ones of the pillars adjacent one another in the same row, the first pair of respective active ones of the pillars neighboring the second pair of respective active ones of the pillars in the first direction, and the active ones of the pillars of the first pair being spaced from one another in the first direction by a distance greater than that at which the active ones of the pillars of the second pair are spaced from one another;
first bit lines and second bit lines extending longitudinally in one direction across the layers, wherein the first bit lines are alternatingly disposed with the second bit lines in a direction perpendicular to said one direction,
a first auxiliary line spanning the pillars of the first pair and electrically connected thereto; and
a second auxiliary line electrically spanning the pillars of the second pair,
wherein the first auxiliary line bends between the pillars of the first pair in a plan view of the pillars and the auxiliary lines, and the first auxiliary line has a middle section that is overlapped by one of the first bit lines, said one of the first bit lines being electrically connected to the first auxiliary line at the middle section of the first auxiliary line, and the second auxiliary line bends between the pillars of the second pair in the plan view of the pillars and the auxiliary lines, and the second auxiliary line has a middle section that is overlapped by one of the second bit lines, said one of the second bit lines being electrically connected to the second auxiliary line at the middle section of the second auxiliary line.

17. The device of claim 16, wherein the second auxiliary line bends to a lesser degree, as between the active ones of the pillars that it spans, than the first auxiliary line.

18. The device of claim 16, wherein the first and second auxiliary lines bend in opposite directions parallel to the columns of the pillars.

19. The device of claim 18, wherein each of the pillars is overlapped by at least three of the bit lines.

20. The device of claim 16, further comprising isolation regions extending vertically through the stack of layers and dividing the stack of layers into sections arrayed in the first direction, wherein the pillars in each of the rows are offset from the pillars in each row of the pillars adjacent thereto such that the pillars of adjacent ones of the rows are disposed in a zigzagging pattern along the first direction, one of the sections of the stack of layers includes nine of the pillars disposed in the zigzagging pattern for each respective pair of adjacent ones of the rows of the vertical pillars, one of the nine pillars being a dummy pillar electrically isolated from the bit lines and the other eight of the vertical pillars being active ones of the pillars each electrically connected to one of the bit lines, the first auxiliary line crosses one of the isolation regions, and the second auxiliary line crosses a vertical plane passing through axial centers of the dummy pillars.

* * * * *